US007259429B2

(12) United States Patent
Yamazaki

(10) Patent No.: US 7,259,429 B2
(45) Date of Patent: Aug. 21, 2007

(54) SEMICONDUCTOR DISPLAY DEVICE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 134 days.

(21) Appl. No.: 10/963,585

(22) Filed: Oct. 14, 2004

(65) Prior Publication Data
US 2005/0087741 A1    Apr. 28, 2005

(30) Foreign Application Priority Data
Oct. 28, 2003    (JP)    ............................ 2003-367639

(51) Int. Cl.
*H01L 23/62*    (2006.01)
(52) U.S. Cl. ............................ 257/356; 257/59; 257/72
(58) Field of Classification Search .................. 257/59, 257/72, 359, 356; 349/139
See application file for complete search history.

(56) References Cited

U.S. PATENT DOCUMENTS

| 5,414,442 | A | 5/1995 | Yamazaki et al. |
| 5,585,949 | A | 12/1996 | Yamazaki et al. |
| 5,784,073 | A | 7/1998 | Yamazaki et al. |
| 5,909,035 | A * | 6/1999 | Kim .............................. 257/59 |
| 5,956,105 | A | 9/1999 | Yamazaki et al. |
| 6,778,231 | B1 | 8/2004 | Yamazaki et al. |
| 6,975,296 | B1 | 12/2005 | Yamazaki et al. |
| 7,067,845 | B2 | 6/2006 | Murakami et al. |
| 2005/0052391 | A1 | 3/2005 | Yamazaki et al. |
| 2006/0121652 | A1 | 6/2006 | Murakami et al. |

FOREIGN PATENT DOCUMENTS

JP    63-010558    1/1988

* cited by examiner

*Primary Examiner*—Sara Crane
(74) *Attorney, Agent, or Firm*—Eric J. Robinson; Robinson Intellectual Property Law Office, P.C.

(57) ABSTRACT

It is an object of the present invention to provide a semiconductor display device using a protective circuit in which dielectric breakdown is prevented more effectively. In the invention, in the cases that a first interlayer insulating film is formed covering a TFT used for a protective circuit and a second interlayer insulating film, which is an insulating coating film, is formed covering a wiring formed over the first interlayer insulating film, a wiring for connecting the TFT to other semiconductor elements is formed so as to be in contact with the surface of the second interlayer insulating film so as to secure a path discharging charge accumulated in the surface of the second interlayer insulating film. Note that the TFT used for the protective diode is a so-called diode-connected TFT in which either of the first terminal or the second terminal is connected to a gate electrode.

30 Claims, 15 Drawing Sheets

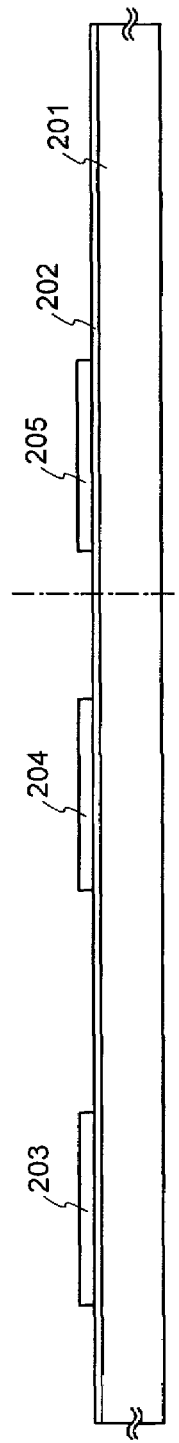
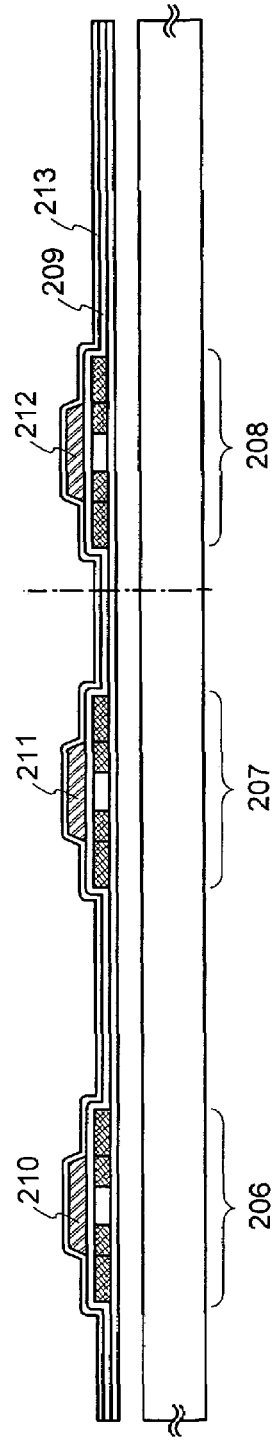
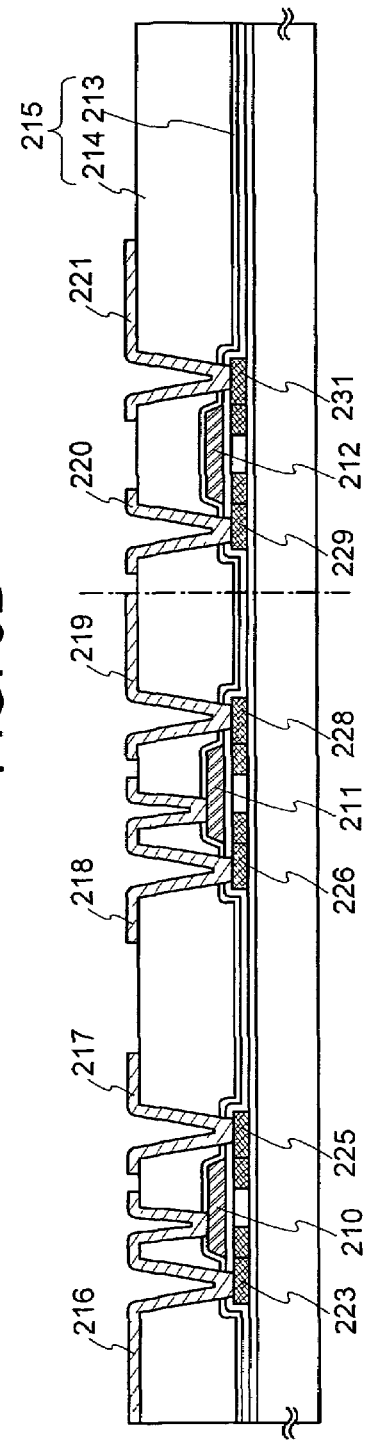

SEMICONDUCTOR DISPLAY DEVICE

BACKGROUND OF THE INVENTION

1. Field of the Invention

The present invention relates to a semiconductor display device using a protective circuit which can prevent a dielectric breakdown of a light emitting element from occurring.

2. Description of the Related Art

How to restrain degradation of the light emitting element or charging phenomena (charging) which leads to dielectric breakdown is an important subject in a manufacturing step of a semiconductor device. Specifically, with high integration, there is a tendency of not only miniaturization of a channel length but also decrease in film thickness of various insulating films typified by a gate insulating film. Consequently, the dielectric breakdown due to the charging becomes a more serious problem.

The cause and environment to occur the charging is extremely complicated and vary. Therefore, it is necessary not only to investigate the cause and the environment to occur the charge, but also to take measures in a structure of the semiconductor device so as to enhance resistance to the degradation or dielectric breakdown due to the charging. In order to prevent the degradation or dielectric breakdown due to the charge, it is effective to ensure a discharge path by the protective circuit using a diode (protective diode). By ensuring the discharge path, charge accumulated in an insulating film is prevented from being discharged in the vicinity of the semiconductor element. Thus, phenomena (ESD: Electro-Static Discharge) in which the semiconductor element is deteriorated and damaged due to energy of discharge can be prevented.

In addition, by providing a protective circuit, even if noise is inputted into a wiring along with a signal and a power supply voltage, a subsequent circuit can be prevented from malfunctioning due to the noise, and a semiconductor device can be prevented from being deteriorated or a damaged due to the noise.

In a semiconductor display device typified by a liquid crystal display device and a light emitting device, an active matrix type in which supply of signal to a display element can be maintained to some extent after inputting a video signal can respond flexibly to a panel with a big size and high precision, and thus the semiconductor display device with an active matrix type has become future mainstream. A structure of a pixel in an active matrix type semiconductor display device which is proposed concretely depends on each of manufacturer in a measure. Usually, a display element such as a light emitting element and a liquid crystal element, and a thin film transistor (hereinafter referred to as TFT) for controlling operation of the display element are provided for each of the pixels.

In the semiconductor display device, there are two kinds of structures that a display element is formed with a wiring connected directly to a first or a second terminal of a TFT over an insulating film (a first interlayer insulating film) which covers the TFT, and that a display element is formed over an insulating film (a second interlayer insulating film) which covers the wiring moreover. In the case of a light emitting device where light from the light emitting element is taken out from the side opposite to the TFT, the latter structure is more desirable for being able to increase contrast more than the former structure since ratio of a region which contributes to luminescence in the entire pixel portion can be increased.

The second interlayer insulating film covering the wiring moreover has a possibility of affecting characteristic of the display element due to its surface unevenness, and therefore, is formed by using a coating method which is easy to flatten. This insulating coating film has a problem of being easily charged when it is formed. However, a TFT is usually used for a protective diode, and the TFT is formed at the same layer as TFTs constituting other circuits. Accordingly, the charge which is charged in an insulating film in a layer formed over an insulating film which covers the TFT used for the protective diode is hard to discharge through a discharge path secured by the protective circuit. Consequently, there has been a problem that dielectric breakdown easily occurs due to the charge.

BRIEF SUMMARY OF THE INVENTION

In view of the above problems, it is an object of the present invention to provide a semiconductor display device using a protective circuit which can effectively prevent dielectric breakdown.

In the present invention, in the case where a first interlayer insulating film is formed to cover a TFT used for a protective diode and a second interlayer insulating film, which is an insulative coating film, is formed to cover a wiring formed over the first interlayer insulating film, a wiring for connecting the TFT to other semiconductor elements is formed to being in contact with the surface of the second interlayer insulating film in order to secure a path for discharging the charge accumulated in the surface of the second interlayer insulating film. Note that the TFT used for the protective diode is so-called a diode-connected TFT in which either of a first terminal or a second terminal of the TFT is connected to a gate electrode.

In this specification, either of the first terminal or the second terminal corresponds to a source region, and the other corresponds to a drain region. The source and the drain regions depend on the electric potential relation between the first terminal and the second terminal. Specifically, in the case of an n-channel type TFT, in the first and the second terminals, the terminal with lower electric potential corresponds to a source region and the terminal with higher electric potential corresponds to a drain region. Further, in the case of a p-channel type TFT, in the first and the second terminals, the terminal with higher electric potential corresponds to a source region and the terminal with lower electric potential corresponds to a drain region.

In the n-channel type TFT which is diode-connected, the first terminal and the gate electrode are presumed to be connected. In this case, when the electric potential of the first terminal is higher than that of the second terminal, the first terminal corresponds to a drain region and the second terminal corresponds to a source region, respectively. Then the n-channel type TFT is turned on. Accordingly, a forward current from the first terminal to the second terminal can be obtained. To the contrary, when the electric potential of the first terminal is lower than that of the second terminal, the first terminal corresponds to a source region and the second terminal corresponds to a drain region, respectively. Then the n-channel type TFT is turned off.

Further, in the p-channel type TFT which is diode-connected, the first terminal and the gate electrode are presumed to be connected. In this case, when the electric potential of the first terminal is higher than that of the second terminal, the first terminal and the second terminal correspond to a source region and a drain region, respectively. Then the p-channel type TFT is turned off. To the contrary, when the electric potential of the first terminal is lower than that of the second terminal, the first terminal and the second terminal correspond to a drain region and a source region, respectively. Then the p-channel type TFT is turned on. Accordingly, a forward current from the second terminal to the first terminal can be obtained.

Specifically, in a semiconductor display device of the present invention, one feature of the invention is that a TFT used for a protective diode is formed over an insulating surface, a first interlayer insulating film is formed to cover the TFT, a second interlayer insulating film is formed to cover the first interlayer insulating film, either a first or a second terminal of the TFT is connected to a gate electrode with a first wiring, the first wiring is connected to a second wiring, the first wiring is formed to be in contact with the surface of the first interlayer insulating film, and the second wiring is formed to be in contact with the surface of the second interlayer insulating film.

In a semiconductor display device of the invention, one feature of the invention is that: a first TFT for supplying a display element with a signal, and a second TFT and a third TFT used for a protective diode are formed over the insulating surface; a first interlayer insulating film is formed to cover the first TFT, the second TFT, and the third TFT; a second interlayer insulating film is formed to cover the first interlayer insulating film; a display element is formed over the second interlayer insulating film; a first terminal or a second terminal of the first TFT is connected to the display element by a first wiring or a second wiring; a first terminal of the second TFT and a gate electrode are connected by a third wiring; a first terminal or a second terminal of the third TFT is connected to the gate electrode by a fourth wiring; a second terminal of the second TFT is connected to the fourth wiring by a fifth wiring and a sixth wiring; the first wiring, the third wiring, the fourth wiring, and the fifth wiring are formed so as to be in contact with the surface of the first interlayer insulating film; and the second wiring and the sixth wiring are formed so as to be in contact with the surface of the second interlayer insulating film.

In addition, one feature of another structure of a semiconductor display device of the invention is that: a first TFT for supplying a display element with a signal, a second TFT and a third TFT used for a protective diode are formed over an insulating surface; a first interlayer insulating film is formed to cover the first TFT, the second TFT, and the third TFT; a second interlayer insulating film is formed to cover the first interlayer insulating film; a display element is formed over the second interlayer insulating film; a first terminal or a second terminal of the first TFT is connected with the display element by a first wiring and a second wiring; a first terminal of the second TFT and a gate electrode are connected with a third wiring; a second terminal of the second TFT, a first terminal or a second terminal of the third TFT, and a gate electrode are connected with a fourth wiring; the fourth wiring is connected with a fifth wiring; the first wiring, the third wiring, and the fourth wiring are formed so as to be in contact with the surface of the first interlayer insulating film; and the second wiring and the fifth wiring are formed so as to be in contact with the surface of the second interlayer insulating film.

In the present invention, according to the above mentioned structure, in the case where a first interlayer insulating film is formed to cover two TFTs used for a protective diode and a second interlayer insulating film is formed to cover a wiring formed over the first interlayer insulating film, a path for discharging charge accumulated in the surface of the second interlayer insulating film can be secured. Thus, a phenomenon to damage a semiconductor element can be prevented by discharging the charge in the surface of the second interlayer insulating film.

BRIEF DESCRIPTION OF THE DRAWINGS

FIGS. 5A to 5C are views showing a method for manufacturing a semiconductor display device of the invention.

DETAILED DESCRIPTION OF THE INVENTION

Figure 1A:
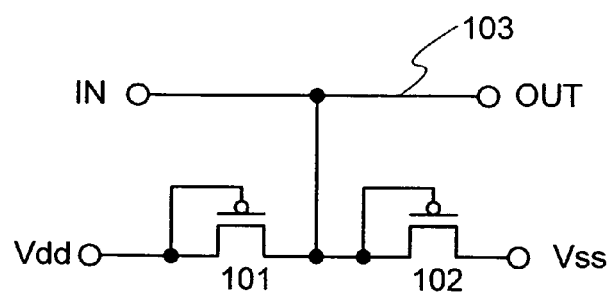
FIGS. 1A to 1C show a circuit diagram and cross sectional views of a protective circuit of the present invention.

A structure of a protective circuit used for a semiconductor display device of the present invention is described with reference to FIGS. 1A to 1C. In the protective circuit of the invention, a protective diode is provided for a discharge path. FIG. 1A corresponds to a circuit diagram showing a mode of the protective circuit of the invention. And at least one of diode-connected TFTs 101 and 102 are provided for the path which discharges positive charge and the path which discharges negative charge respectively.

Concretely, in each of the TFTs 101 and 102, a first terminal and a gate electrode are connected. And the electric potential Vdd is given to the first terminal in the TFT 101, and the electric potential Vss is given to a second terminal in the TFT 102. In this specification, it is assumed that electric potential Vss is less than electric potential Vdd. Further a second terminal of the TFT 101 and the first terminal of the TFT 102 are electrically connected each other, and further electrically connected to the semiconductor element to be protected each other. It is assumed that the second terminal of the TFT 101 and the first terminal of the TFT 102 are electrically connected to a wiring 103.

In addition, in FIG. 1A, an example that both of the TFTs 101 and 102 are p-channel type TFTs are shown; however, either of the TFTs 101 or 102 may be an n-channel type TFT or both of the TFTs 101 and 102 may be n-channel type TFTs. In the case of using the n-channel type TFT, the first terminal and the gate electrode are connected.

And in the protective circuit of the invention, wirings for electrically connecting the TFTs used for the protective diode, specifically; the layout thereof has a characteristic. FIG. 1B shows a cross sectional view of the TFT 101 and the TFT 102 as an example.

The TFT 101 includes an island shape semiconductor film 104, a gate insulating film 105 being in contact with the island shape semiconductor film 104, and a gate electrode 106 overlapped with the island shape semiconductor 104 while sandwiching the gate insulating film 105 therebetween. The island shape semiconductor film 104 includes a channel formation region 107 overlapped with the gate electrode 106, and also includes a first terminal 108 and a second terminal 109 corresponding to a source or drain region sandwiching the channel formation region 107 therebetween.

The TFT 102 includes an island shape semiconductor film 114, a gate insulating film 105 being in contact with the island shape semiconductor film 114, and a gate electrode 116 overlapped with the island shape semiconductor film 114 while sandwiching the gate insulating film 105 therebetween. The island shape semiconductor film 114 includes a channel formation region 117 overlapped with the gate electrode 116, and also includes a first terminal 118 and a second terminal 119 which correspond to a source region or a drain region sandwiching the channel formation region 117 therebetween.

And the TFTs 101 and 102 are covered with a first interlayer insulating film 120 having a single or a plurality of insulating films. And, wirings 121 to 124 connected to the TFTs 101 and 102 through contact holes formed in the first interlayer insulating film 120 are formed so as to be in contact with the surface of the first interlayer insulating film 120.

Specifically, the wiring 121 is connected to the first terminal 108 and the gate electrode 106 of the TFT 101, and the wiring 122 is connected to the second terminal 109 of the TFT 101. In addition, the wiring 123 is connected to the first terminal 118 and the gate electrode 116 of the TFT 102, and the wiring 124 is connected to the second terminal 119 of the TFT 102.

Figure 1B:
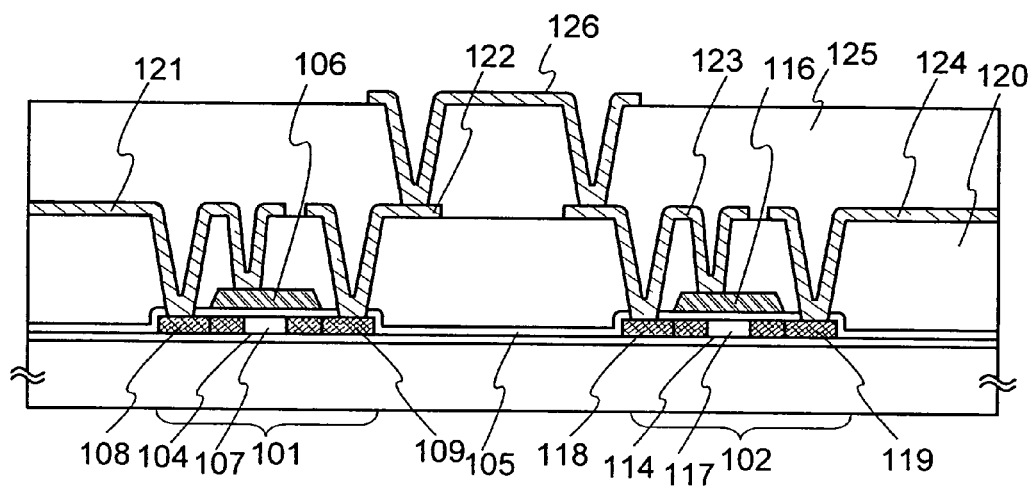

In FIG. 1B, each of the wirings 121 to 124 is formed from a single wiring, however, the invention is not limited thereto. The wirings 121 to 124 may be formed from a plurality of wirings each of which is electrically connected each other.

A second interlayer insulating film 125 is formed over the first interlayer insulating film 120 so as to cover the wirings 121 to 124. Since a display element is required to be formed over the second interlayer insulating film 125, the surface thereof is desirably well flattened, and preferably formed by a coating method. Note that the second interlayer insulating film 125 may be formed of a single insulating film or a plurality of insulating films. In each case, at least a layer of the insulating films is formed by the coating method preferably.

And a wiring 126 connected to the wirings 122 and 123 through contact holes formed in the second interlayer insulating film 125 is formed so as to be in contact with the surface of the second interlayer insulating film 125. By using the wirings 122, 123, and 126, the second terminal 109 of the TFT 101, and the first terminal and the gate electrode 116 of the TFT 102 are electrically connected. And, the wirings 122, 123, and 126 are electrically connected to a wiring 103 shown in FIG. 1A.

In FIG. 1B, the wiring 126 is constituted from a single wiring; however, the invention is not limited to this structure. The wiring 126 may be constituted from a plurality of wirings each of which is connected electrically.

In addition, the wirings 122 and 123 are electrically connected through the wiring 126 in the invention; however, the invention is not limited to this structure. For example, as shown in FIG. 1C, the second terminal 109 of the TFT 101, and the first terminal 118 and the gate electrode 116 of the TFT 102 may be connected by a wiring 127 formed so as to be in contact with the surface of the first interlayer insulating film 120. The wiring 127 may be constituted of a single wiring or a plurality of wirings in which each of wirings is electrically connected. And the wiring 127 is also connected to the wiring 126.

Figure 1C:
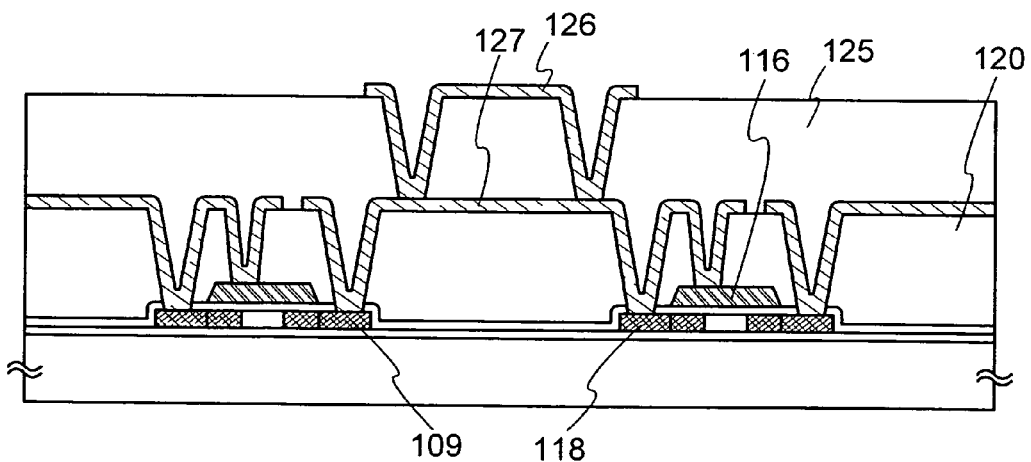

In FIG. 1B, the wirings which are directly connected to the TFTs can be shortened in comparison to those in FIG. 1C, thereby preventing dielectric breakdown from occurring in the TFTs 101 and 102 by an antenna effect. Further, in FIG. 1C, a path for discharging is already secured by the protective circuit before forming the second interlayer insulating film 125; ESD due to charging can be certainly prevented.

Figure 2A:
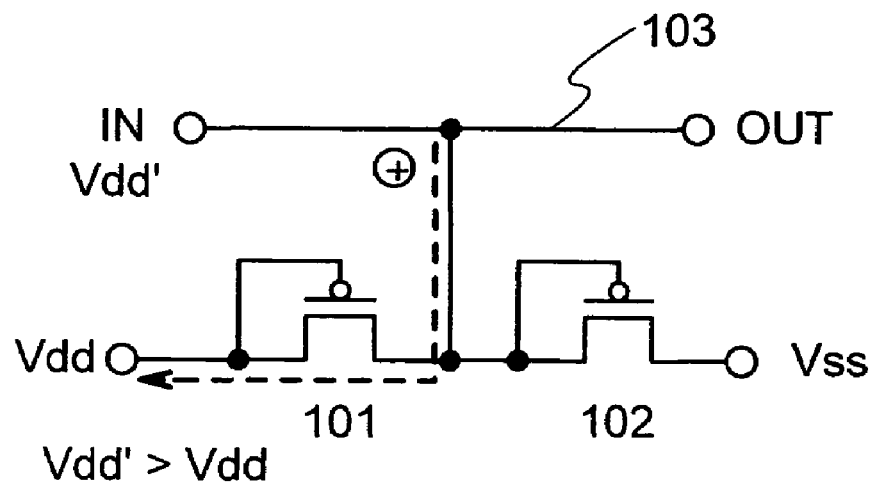
FIGS. 2A and 2B are circuit diagrams showing a protective circuit of the invention.
Figure 2B:
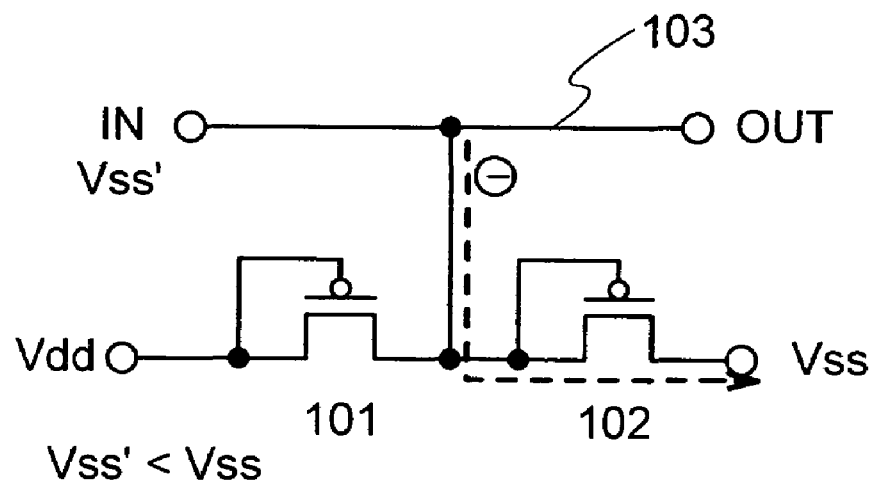

And in FIG. 1B and FIG. 1C, for example, in the case where positive charge is charged on the surface of the second interlayer insulating film 125 and electric potential Vdd' having higher electric potential than electric potential Vdd is given to the wiring 126, the TFT 101 is turned on and the TFT 102 is turned off as shown in FIG. 2A. Accordingly the positive charge is discharged through the TFT 101. In addition, in FIG. 1B and FIG. 1C, in the case where negative charge is charged on the surface of the second interlayer insulating film 125 and electric potential Vss' having lower electric potential than electric potential Vss is given to the wiring 126, the TFT 101 is turned off and the TFT 102 is turned on as shown in FIG. 2B. Accordingly the negative charge is discharged through the TFT 102.

Accordingly, in each case, the electric potential that is higher than the electric potential Vdd and lower than the electric potential Vss is not given to the wiring 103. Therefore, damage due to charging to a semiconductor element electrically connected to the wiring 103 can be prevented.

Note that the protective circuit is specifically effective in preventing the semiconductor element from being deteriorated and damaged due to the charging caused when the second interlayer insulating film is formed by a coating method. However, in the semiconductor display device of the invention, the second interlayer insulating film is not limited to a coating film. The cause and environment to occur charging are extremely complicated and vary, and therefore it is undeniable that charging may occur when the second interlayer insulating film is not formed by the coating method. Consequently, the invention is effective for preventing ESD in the case the second interlayer insulating film is formed by a method other than the coating method, for example, by vapor deposition, sputtering, or chemical vapor deposition (CVD).

Figure 3:
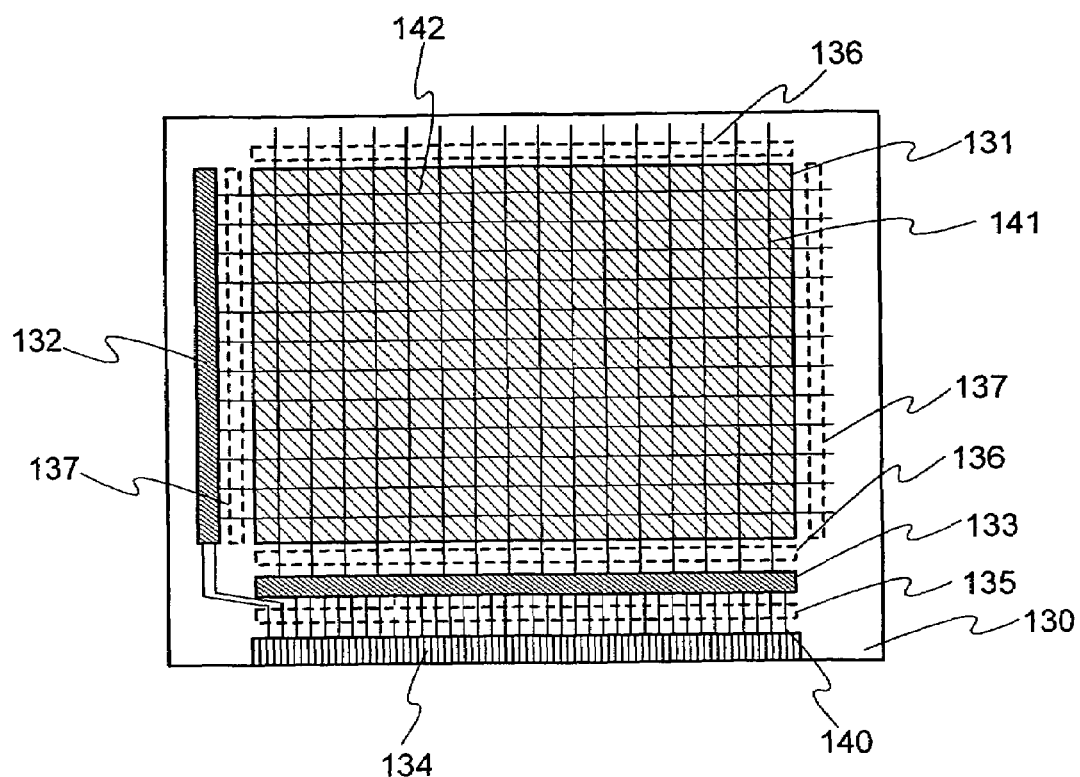
FIG. 3 is a top view of a substrate provided with a protective circuit of the invention.

Next, a structure of a semiconductor display device of the invention is described with reference to FIG. 3. FIG. 3 is a top view of a substrate 130 included in the semiconductor display device. A pixel portion 131, a scanning line driver circuit 132 for selecting a pixel included in the pixel portion 131, and a signal line driver circuit 133 for supplying a video signal for the selected pixel are formed over the substrate 130. Further, a reference numeral 134 corresponds to an input terminal for supplying a signal or a power supply potential into the each circuit formed over the substrate 130.

And reference numerals 135 to 137 correspond to protective circuits. The various circuits formed over the substrate 130 are connected each other with wirings and the wirings are connected to the protective circuits 135 to 137.

Specifically, the input terminal 134 and the signal line driver circuit 133 are connected by a wiring 140, and the protective circuit 135 is connected to the wiring 140. Each of the semiconductor elements included in the signal line driver circuit 133 is protected by the protective circuit 135.

The signal line driver circuit 133 and the pixel portion 131 are connected by a signal line 141, and the protective circuit 136 is connected to the signal line 141. Each of the semiconductor elements included in the signal line driver circuit 133 and the pixel portion 131 is protected by the protective circuit 136. Note that the protective circuit 136 has at least a connection with the signal line 141. Therefore, the protective circuit 136 may be provided between the signal line driver circuit 133 and the pixel portion 131, or may be provided on the other side of the signal line driver circuit 133 sandwiching the pixel portion 131 therebetween as shown in FIG. 3. Though not shown in figure, the protective circuit 136 may be provided between the signal line driver circuit 133 and the input terminal 134.

Further, the scanning line driver circuit 132 and the pixel portion 131 are connected by a scanning line 142, and the protective circuit 137 is connected to the scanning line 142. With the use of the protective circuit 137, each of the semiconductor elements included in the scanning line driver circuit 132 and the pixel portion 131 can be protected. Note that the protective circuit 137 has at least a connection with the scanning line 142. The protective circuit 137 may be provided between the scanning line driver circuit 132 and the pixel portion 131, or may be provided on the other side of the scanning line driver circuit 132 sandwiching the pixel portion 131 therebetween as shown in FIG. 3. Though not shown in figure, the protective circuit 137 may be provided between the scanning line driver circuit 132 and the input terminal 134.

Note that not all of the protective circuits 135 to 137 are required to be provided, one of them or a plurality of protective circuits among them may be provided.

In this invention, the protective circuit serves not only to discharge charge in the second interlayer insulating film, but also to decrease noise inputted to the wiring along with the signal or the power supply voltage. As a result, a situation that the semiconductor element is deteriorated or damaged due to the noise can be prevented.

In FIG. 3, the signal line driver circuit 133 and the scanning line driver circuit 132 are formed over the substrate 130 in which the pixel portion 131 is formed. However, the invention is not limited to this structure. For example, in the case of using an amorphous semiconductor or a microcrystal semiconductor as the semiconductor element constituting the pixel portion 131, the signal line driver circuit 133 and the scanning line driver circuit 132 which are formed separately may be mounted over the substrate 130 by a known method such as a COG method or a TAB method. In this case, the protective circuit is connected to the wiring which connects the input terminal and the pixel portion. Further, in the case of using the microcrystal semiconductor as the element constituting the pixel portion 131, the scanning line driver circuit and the pixel portion may be formed of the microcrystal semiconductor on the same substrate, and then the signal line driver circuit may be equipped with the substrate. And one part of the scanning line driver circuits or one part of the signal line driver circuits may be formed over the same substrate along with the pixel portion, and then other parts of the scanning line driver circuits or other part of the signal line driver circuits may be equipped with the substrate. Namely, because there are a variety of modes in the protective circuit, the number of and the location of the protective circuit are to be fixed in accordance with the mode.

Next, a specific example of the protective circuit used in this invention is described with reference to FIGS. 4A to 4E.

Figure 4A:
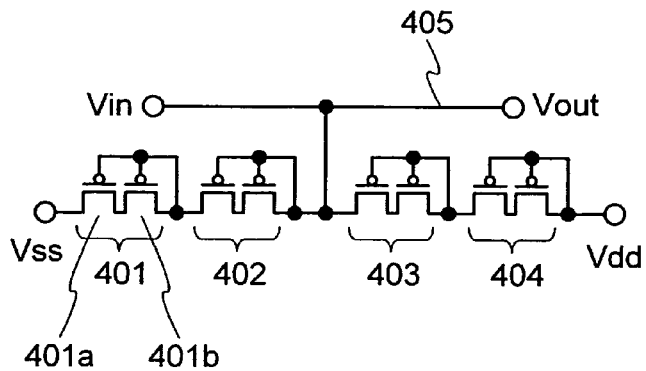
FIGS. 4A to 4E are circuit diagrams of a protective circuit of the invention.

The protective circuit shown in FIG. 4A includes protective diodes 401 to 404 using a plurality of TFTs. The protective diode 401 includes two p-channel type TFTs 401a and 401b which are serially connected. And one end of the p-channel type TFTs 401a and 401b serially connected is connected to a gate electrode of the two p-channel type TFTs 401a and 401b. Other protective diodes 402 to 404, as with the protective diode 401, also include a plurality of TFTs in which each of TFTs is serially connected. And one end of the plurality of TFTs serially connected is connected to the gate electrode of the plurality of TFTs.

In the invention, the number and the polarity of TFTs in each of the protective diodes 401 to 404 are not limited to the structure shown in FIG. 4A.

Protective diodes 401 to 404 are serially connected in order, and a node between the protective diode 402 and the protective diode 403 is connected to a wiring 405. The wiring 405 is presumed to be connected to a semiconductor element which becomes a subject of protection. The node connecting with the wiring 405 is not limited to the node between the protective diode 402 and the protective diode 403. And the node connecting to the wiring 405 may be any one of the plurality of nodes among the protective diodes 401 to 404 serially connected.

Electric potential Vss is given to an end of the protective diodes 401 to 404 serially connected, and electric potential Vdd is given to the other end. Further, each of the protective diodes 401 to 404 is connected in a direction that voltage of reverse bias is applied.

Figure 4B:
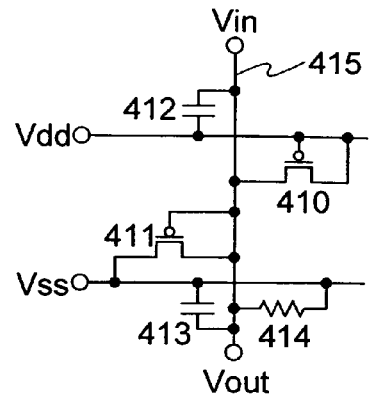

A protective circuit shown in FIG. 4B includes protective diodes 410 and 411, capacitor elements 412 and 413, and a resistance element 414. The resistance element 414 is a resistance of two terminals, and one terminal is given electric potential Vin that is to be applied to a wiring 415, and the other is given electric potential Vss. The resistance element 414 is provided for shifting the electric potential of the wiring 415 to the electric potential Vss when the electric potential Vin become impossible to be applied, and the resistance value is set to be much larger than wiring resistance of the wiring 415. A p-channel type TFT which is diode-connected is used for each of the protective diodes 410 and 411.

When the electric potential Vin is higher than the electric potential Vdd, according to the voltage between the gate electrode and the source region, the p-channel type TFT included in the protective diode 410 is turned on, and the p-channel type TFT included in the protective diode 411 is turned off. Thus, the electric potential Vdd is given to the wiring 415 through the protective diode 410. Therefore, even when the electric potential Vin becomes higher than the electric potential Vdd due to noise or the like, the electric potential to be given to the wiring 415 does not become higher than the electric potential Vdd. On the other hand, when the electric potential Vin is lower than the electric potential Vss, according to the voltage between the gate electrode and the source region, the p-channel type TFT included in the protective diode 410 is turned off and the p-channel type TFT included in the protective diode 411 is turned on. Accordingly, the electric potential Vss is given to the wiring. Therefore, when the electric potential Vin becomes lower than the electric potential Vss due to noise or the like, the electric potential to be given to the wiring 415 does not become lower than the electric potential Vss. Furthermore, by the use of the capacitor elements 412 and 413, pulsed noise of inputted electric potential Vin can be decreased and sudden change of the electric potential due to the noise can be decreased to some extent.

By the layout of the protective circuit as above mentioned, the electric potential of the wiring is kept between the electric potential Vss and Vdd, and it becomes possible to prevent the extremely high or low voltage out of this electric potential from being applied to the subsequent circuit. Further, by providing the protective circuit to the input terminal in which the signal is inputted, the electric potential of all of the wirings in which the signal is applied can be kept constant height (here, electric potential Vss). Namely, when the signal is not inputted, it also has a function of a short ring which can short wirings. Therefore, dielectric breakdown caused by electric potential difference between wirings can be prevented. Further, when the signal is inputted, since the resistance value of the resistance element 414 is high enough, the signal applied to the wiring is not pulled by the electric potential Vss.

Figure 4C:
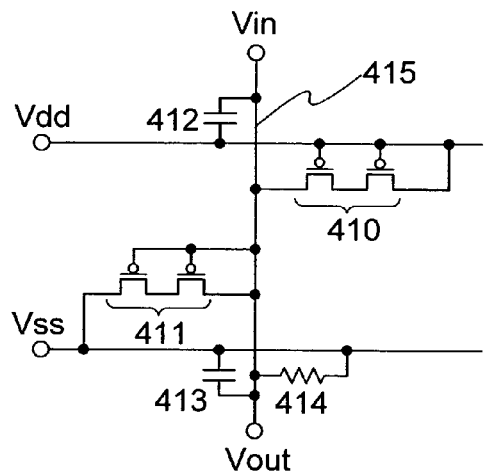

FIG. 4C is an equivalent circuit schematic of a protective circuit in which the protective diodes 410 and 411 are substituted by two p-channel type TFTs.

Although a p-channel type TFT which is diode-connected is used as the protective diode in the protective circuits shown in FIGS. 4B and 4C, the invention is not limited to the structure. As the protective diode, an n-channel type TFT which is diode-connected may be used.

Figure 4D:
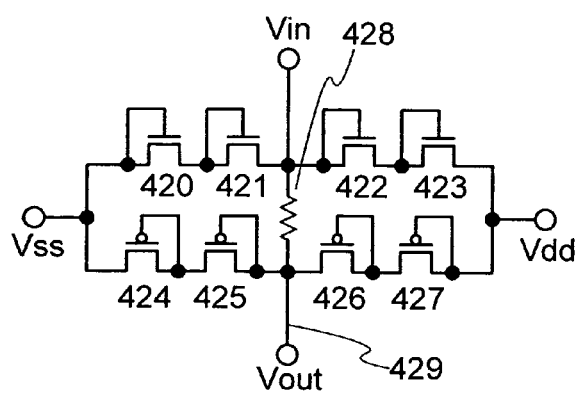

Protective diodes 420 to 427 and a resistance element 428 are included in the protective circuits shown in FIG. 4D. The resistance element 428 and a wiring 429 are serially connected. The n-channel type TFT which is diode-connected is used for each of the protective diodes 420 to 423. And the p-channel type TFT each of which is diode-connected is used for each of the protective diodes 424 to 427.

The protective diodes 420 and 421 are serially connected, and electrical potential Vss is given to one end and the other end is connected to the wiring 429. The protective diodes 422 and 423 are serially connected, and electrical potential Vdd is given to one end and the other end is connected to the wiring 429. The protective diodes 424 and 425 are serially connected, and electrical potential Vss is given to one end and the other end is connected to the wiring 429. The protective diodes 426 and 427 are serially connected, and electrical potential Vdd is given to one end and the other end is connected to the wiring 429.

Figure 4E:
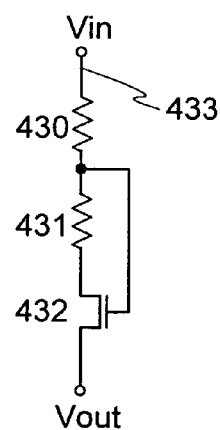

Further, a protective circuit shown in FIG. 4E includes resistance elements 430 and 431 and a protective diode 432. In FIG. 4E, the n-channel type TFT which is diode-connected is used as the protective diode 432; however the invention is not limited to this structure. Alternatively, the p-channel type TFT which is diode-connected may be used or a plurality of TFTs each of which is diode-connected may be used. The resistance elements 430 and 431 and the protective circuit 432 are serially connected to a wiring 433.

By using the resistance elements 430 and 431, sudden change of the electric potential in the wiring 433 can be relaxed, and deterioration or damage of the semiconductor element can be prevented. Further, the use of the protective diode 432 can prevent reverse bias current from flowing toward the wiring 433 due to the fluctuation of the electric potential.

In the case of connecting only the resistance elements serially to the wiring, the sudden fluctuation of the electric potential in the wiring can be relaxed, and deterioration or damage of the semiconductor element can be prevented. In addition, in the case of connecting only the protective diode to the wiring, the flow of the reverse current toward the wiring due to the fluctuation of the electric potential can be prevented.

EMBODIMENT 1

Next, a specific method for manufacturing a light emitting device which corresponds to a mode of a semiconductor display device of the present invention is described. In this embodiment, an example of manufacturing a TFT used for the protective circuit and a TFT for controlling current supply to a light emitting element over the same substrate is described.

First, a base film 202 is formed on a substrate 201 as shown in FIG. 5A. A glass substrate such as barium borosilicate glass or alumino borosilicate glass, a quartz substrate, a ceramic substrate, or the like can be used for the substrate 201, for example. A metal substrate including a SUS substrate or a substrate in which an insulating film is formed over a surface of the silicon substrate may be used for the substrate 201. A substrate formed of a synthetic resin having flexibility such as plastic or the like generally tends to have lower resistance temperature compared to the above substrates, however a substrate which can withstands the processing temperature in manufacture steps can be used.

The base film 202 is formed in order to prevent an alkaline metal such as Na and an alkaline earth metal contained within the substrate 201 from diffusing into a semiconductor film and exerting an adverse influence on characteristics of a semiconductor element such as a TFT. The base film 202 is therefore formed by using an insulating film such as a silicon oxide film, a silicon nitride film, or a silicon nitride oxide film capable of suppressing the diffusion of the alkaline metal and the alkaline earth metal to the semiconductor film. In this embodiment, the base film 202 is formed of a silicon nitride oxide to have a thickness of 10 nm to 400 nm (preferably 50 nm to 300 nm) by plasma CVD.

Note that the base film 202 may be a single layer, or may be a laminate of a plurality of insulating films. Further, it is effective to form the base film in order to prevent impurity diffusion in the case of using a substrate that contains a certain amount of the alkaline metal or the alkaline earth metal, such as a glass substrate, or an SUS substrate. However, the base film need not to be formed in the case of using a quartz substrate or the like, in which impurity diffusion does not matter.

Island shape semiconductor films 203 to 205 to be used as an active layer are formed over the base film 202. The film thickness of the island shape semiconductor films 203 to 205 are set from 25 nm to 100 nm (preferably from 30 nm to 60 nm). Note that the island shape semiconductor film 203 to 205 may be an amorphous semiconductor, a semi-amorphous semiconductor (microcrystalline semiconductor), or a polycrystalline semiconductor. Further, not only silicon but also silicon germanium can be used for the semiconductor. It is preferable that the germanium concentration is on the order of 0.01 to 4.5 atomic % when silicon germanium is used.

When a polycrystalline semiconductor is used, an amorphous semiconductor is formed first. The amorphous semiconductor may be then crystallized by using a known method for crystallizing an amorphous semiconductor. A method for performing crystallization by heating using a heater, a method for performing crystallization by laser light irradiation, a method for performing crystallization by using a catalyst metal, a method for performing crystallization by using infrared light, and the like can be given as known methods of crystallization.

In the case of crystallizing the amorphous semiconductor film by using laser light, for example, a pulsed laser or a continuous wave excimer laser, a pulsed laser or a continuous wave YAG laser, a pulsed laser or a continuous wave $YVO_4$ laser, or the like is used. For example, when a YAG laser is used, a wavelength of a second harmonic, which tends to easily be absorbed by the semiconductor film, is desirably employed. The oscillating frequency is set from 30 kHz to 300 kHz, the energy density is set from 300 mJ/cm$^2$ to 600 mJ/cm$^2$ (typically from 350 mJ/cm$^2$ to 500 mJ/cm$^2$), and the scanning speed may be set so that several irradiation shots can be emitted at an arbitrary point.

Next, a TFT is formed by using the island shape semiconductor films 203 to 205. In this embodiment, as shown in FIG. 5B, top gate type TFTs 206 to 208 are formed by using the island shape semiconductor films 203 to 205.

Specifically, a gate insulating film 209 is formed so as to cover the island shape semiconductor films 203 to 205. A conductive film is formed and patterned over the gate insulating film 209, thereby forming gate electrodes 210 to 212. And then, by using the gate electrodes 210 to 212 or a resist as a mask and doping n-type or p-type impurities to the island shape semiconductor films 203 to 205, a source region, a drain region, and an LDD region and the like are formed. Here, the case where all the TFTs 206 to 208 are p-type is described.

Silicon oxide, silicon nitride, silicon nitride oxide, or the like can be used as the gate insulating film 209, for example. Further, plasma CVD, sputtering, and the like can be used as the film formation method. For example, when the gate insulating film using silicon oxide is deposited by using plasma CVD, film formation may be performed by using a mixed gas of tetraethyl orthosilicate (TEOS) and $O_2$, at a reaction pressure of 40 Pa, a substrate temperature of 300° C. to 400° C., and a RF power density (13.56 MHz) of 0.5 W/cm$^2$ to 0.8 W/cm$^2$.

Further, aluminum nitride can also be used as the gate insulating film 209. The thermal conductivity coefficient of aluminum nitride is relatively high, and heat generated in a TFT can be diffused efficiently. Further, a gate insulating film in which aluminum nitride is laminated after forming silicon oxide, silicon oxynitride, or the like, which contain no aluminum, may also be used.

According to the series of steps, TFTs 206 and 207 used for the protective diode and a TFT 208 for controlling current to supply to a light emitting element can be formed. Note that the method for manufacturing the TFT is not limited to the above-mentioned steps. A gate electrode and a wiring may be manufactured by drop discharging.

Next, a passivation film 213 which corresponds to one part of a first interlayer insulating film is formed so as to cover the TFTs 206 to 208. An insulating film such as silicon oxide, silicon nitride, or silicon oxynitride each of which includes silicon is used for the passivation film 213, and the film thickness is set about from 100 nm to 200 nm.

Heat treatment is performed in order to activate an impurity element added to the island shape semiconductor films 203 to 205. This step can be performed by thermal annealing using an annealing furnace, by laser annealing, or by rapid thermal annealing (RTA). For example, in the case of performing activation by thermal annealing, it is performed at a temperature of 400° C. to 700° C. (preferably from 500° C. to 600° C.) under a nitrogen atmosphere containing an oxygen at its concentration of equal to or less than 1 ppm, preferably equal to or less than 0.1 ppm. In addition, heat treatment is performed at 300° C. to 450° C. for 1 to 12 hours within an atmosphere containing 3% to 100% hydrogen, thereby performing hydrogenation of the island shape semiconductor films. This step is performed for the purpose of terminating dangling bonds by thermally excited hydrogen. Plasma hydrogenation (using hydrogen excited by plasma) may be also performed as the other means of hydrogenation. Further, the activation step may be performed before forming the passivation film 213.

Next, as shown in FIG. 5C, a first insulating film 214 is formed so as to cover the passivation film 213. An insulating film including Si—O bonds and Si—CH$_x$ bonds formed from an organic resin film, an inorganic insulating film, and a material of an siloxane group as a starting material can be used for the first insulating film 214. In this embodiment, a lamination film of the first insulating film 214 and the passivation film 213 corresponds to a first interlayer insulating film 215. Note that the first interlayer insulating film 215 may be formed of a single insulating film or a plurality of insulating films.

Then, the gate insulating film 209 and the first interlayer insulating film 215 are etched to form contact holes. And then, wirings 216 to 221 for connecting the island shape semiconductor films 203 to 205 and the gate electrodes 210 and 211 are formed so as to be in contact with the first interlayer insulating film 215.

In the TFT 206, a first terminal 223 which corresponds to a source region or a drain region, and the gate electrode 210 are connected by the wiring 216. And a second terminal 225 which corresponds to a source region or a drain region of the TFT 206 is connected to the wiring 217. In the TFT 207, a first terminal 226 which corresponds to a source region or a drain region is connected to the gate electrode 211 by the wiring 218. Further, a second terminal 228 which corresponds to a source region or a drain region of the TFT 207 is connected to the wiring 219. In the TFT 208, a first terminal 229 which corresponds to a source region or a drain region is connected to the wiring 220. A second terminal 231 which corresponds to a source region or a drain region of the TFT 208 is connected to the wiring 221.

Figure 6A:
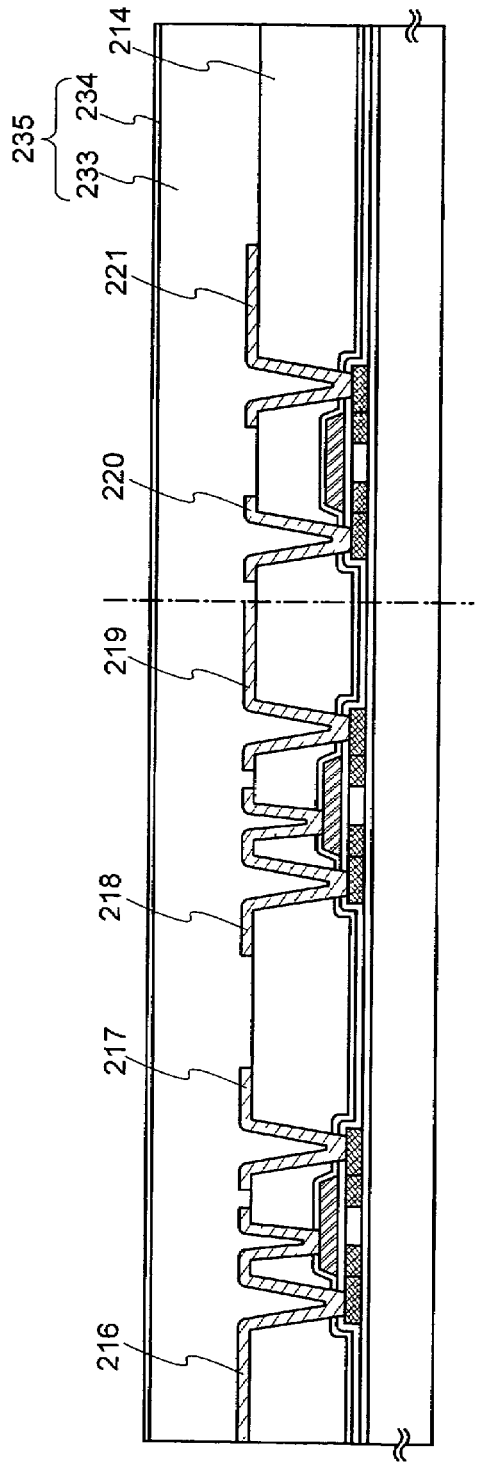
FIGS. 6A and 6B are views showing a method for manufacturing a semiconductor display device of the invention.

Next, as shown in FIG. 6A, a second insulating film 233 and a third insulating film 234 are sequentially formed so as to cover the wirings 216 to 221 and so as to be in contact with the surface of the first insulating film 214. The laminated film of the second insulating film 233 and the third insulating film 234 corresponds to a second interlayer insulating film 235. Note that the second interlayer insulating film 235 may be formed of a single insulating film or a plurality of insulating films.

An insulating film including Si—O bonds and Si—CH$_x$ bonds formed from an organic resin film, an inorganic insulating film, and a material of a siloxane group as a starting material, can be used for the second insulating film 233. In this embodiment, the second insulating film 233 is formed from an insulating film formed of a material of the siloxane group by a coating method. A film which is hardly penetrated by a substance to promote deterioration of a light emitting element such as moisture and oxygen, as compared with other insulating films, is used for the third insulating film 234. Typically, a silicon nitride film formed by RF sputtering is used; however, a diamond like carbon (DLC) film, an aluminum nitride film, or the like is used.

Figure 6B:
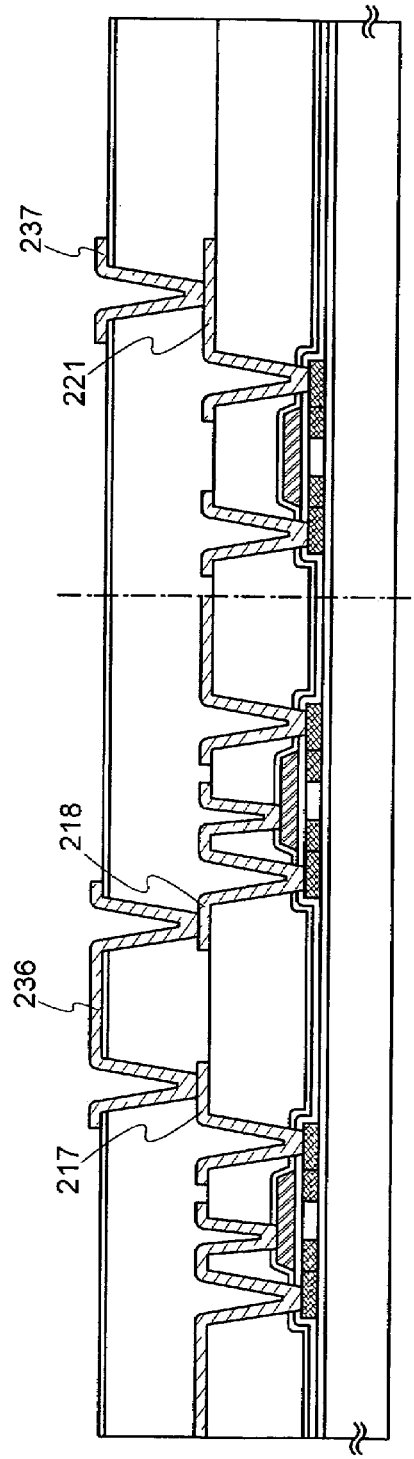

Next, as shown in FIG. 6B, the second interlayer insulating film 235 is etched to form a contact hole. And, wirings 236 and 237 connected to the wirings 217, 218, and 221 are formed so as to be in contact with the surface of the second interlayer insulating film 235. Specifically, the wiring 236 is connected to the wirings 217 and 218, and the wiring 237 is connected to the wiring 221.

Figure 7A:
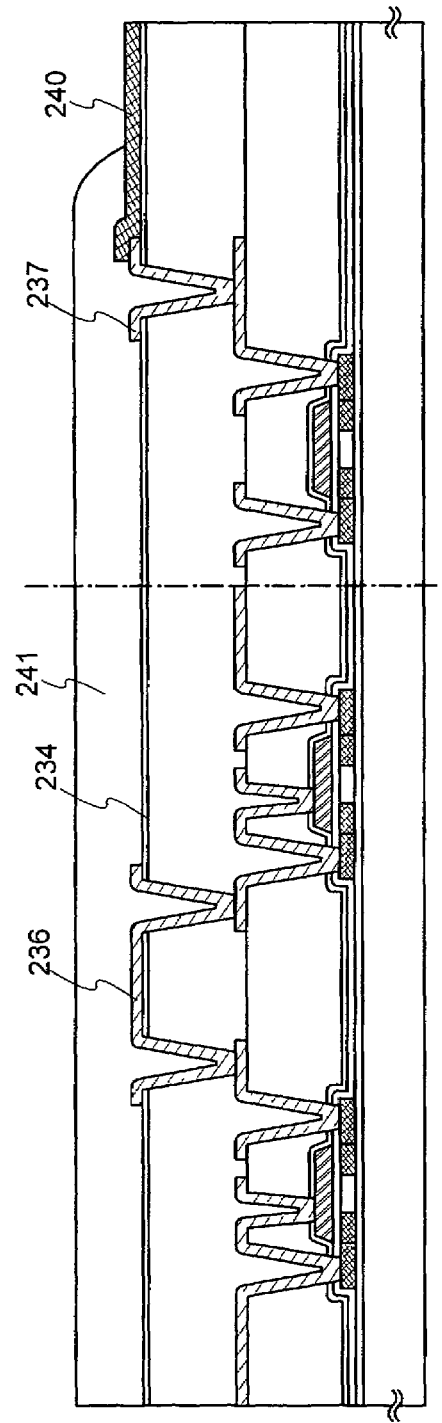
FIGS. 7A and 7B are views showing a method for manufacturing a semiconductor display device of the invention.

As shown in FIG. 7A, an anode 240 is formed so as to cover the wirings 236 and 237, and to be in contact with the surface of the third insulating film 234. The anode 240 is connected to the wiring 237. As the anode 240, a single layer film formed of one of TiN, ZrN, Ti, W, Ni, Pt, Cr, Ag, and the like or a plurality of those, a laminated film mainly containing titanium nitride and aluminum, or a three layer structure of a film mainly containing a titanium nitride film and aluminum and a titanium nitride film can be used. In this embodiment, TiN is used to form the anode 240.

In this embodiment, the case where light is taken out from a cathode side is described, however, light may be taken out from the anode 240 side. In this case, other light-transparent oxide conductive materials such as indium tin oxide (ITO), zinc oxide (ZnO), indium zinc oxide (IZO), and zinc oxide (GZO) to which gallium is added, can be used for the anode 240. In addition, indium tin oxide including ITO and silicon oxide (hereinafter referred to as ITSO), or indium oxide including silicon oxide in which 2% to 20% of zinc oxide (ZnO) is further mixed may be used.

Next, a barrier 241 is formed over the third insulating film 234. An insulating film including Si—O bonds and Si—$CH_x$ bonds formed from an organic resin film, inorganic insulating film, and a material of a siloxane group as a starting material can be used for the barrier 241. The barrier 241 is to cover an end portion of the anode 240, and to include an opening portion in the region overlapped with the anode 240. The end portion of the opening portion of the barrier 241 is desirably rounded so as not to have a hole in the electroluminescent layer formed later in the end portion. Specifically, it is preferable that a curved curvature radius which is drawn by a cross section of the barrier 241 in the opening portion is approximately 0.2 μm to 2 μm.

In FIG. 7A, an example of using a positive type photosensitive acrylic resin as the barrier 241 is shown. In the photosensitive acrylic resin, there are a positive type in which a place exposed to an energy line such as light, electron, ion is removed and a negative type in which a place exposed is left. In the invention, the negative type organic resin film may be used. Further, the barrier 241 may be formed of using photosensitive polyimide. In the case of forming the barrier 241 by using the negative type acrylic, the end portion in the opening portion has a sigmoid cross section. At this time the curvature radius in the upper end portion and bottom end portion in the opening portion is desirably from 0.2 μm to 2 μm.

According to the above mentioned structure, coverage of an electroluminescent layer and a cathode to be formed later can be improved, and the anode 240 and the cathode can be prevented from being short-circuited in a hole formed in the electroluminescent layer. Further, by alleviating the stress of the electroluminescent layer, a defect called shrink in which a light emitting region is diminished can be suppressed and the reliability can be thus improved.

In order that a surface of the anode 240 can be flattened, before forming the electroluminescent layer, the surface may be polished by CMP, polyvinyl alcohol porous body or the like.

Heat treatment in an atmospheric air or heat treatment in a vacuum atmosphere (vacuum bake) may be performed in order to remove absorbed moisture, oxygen, or the like in the barrier 241 and the anode 240 before forming the electroluminescent layer. Specifically, the heat treatment is performed in a vacuum atmosphere, with a substrate temperature of from 200° C. to 450° C., preferably 250° C. to 300° C. for about 0.5 to 20 hours. It is desirably set the vacuum atmosphere at $3 \times 10^{-7}$ Torr or less, and if possible at $3 \times 10^{-8}$ Torr or less. In the case where the electroluminescent layer is formed after performing the heat treatment in the vacuum atmosphere, the reliability can be further improved by setting the substrate in the vacuum atmosphere just before forming the electroluminescent layer. Also, the anode 240 may be irradiated with ultraviolet radiation before or after vacuum baking.

By forming an electrode which is formed so as to be in contact with the second interlayer insulating film 235 (in this embodiment, the anode 240) from a light-transparent conductive oxide material such as ITSO and a conductive film including silicon oxide, and by forming an insulating film being in contact with the electrode in the second interlayer insulating film 235 (in this embodiment, the third insulating film 234) with silicon nitride, brightness of the light emitting element can be increased than that of the combination in the case that the anode 240 and the third insulating film 234 are formed of other materials. In this case, moisture is easily absorbed due to the silicon oxide included in the anode 240, thus the above mentioned vacuum baking is extremely effective.

Figure 7B:
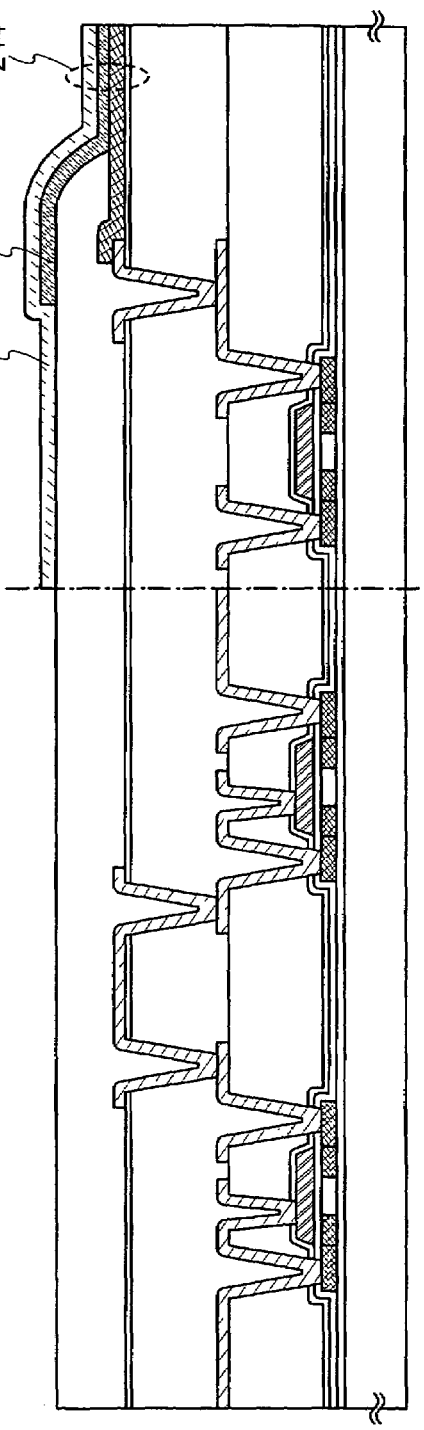

Next, as shown in FIG. 7B, an electroluminescent layer 242 is formed over the anode 240. The electroluminescent layer 242 is formed of a single layer or a plurality of layers; each of the layers may include an inorganic material in addition to an organic material. In the case where work function of the material used for the cathode is not adequately small, the electroluminescent layer 242 is desirably provided with an electron injection layer.

Next, a cathode 243 is formed to cover the electroluminescent layer 242. The anode 240, the electroluminescent layer 242, and the cathode 243 are overlapped with each other in the opening portion of the barrier 241. And the overlapped portion corresponds to a light emitting element 244.

The cathode 243 has a light-transparent property. Specifically, other light-transparent conductive oxide materials such as indium tin oxide (ITO), zinc oxide (ZnO), indium zinc oxide (IZO), zinc oxide (GZO) to which gallium is added can be used. Further, indium tin oxide including ITO and silicon oxide (hereinafter referred to as ITSO), indium oxide including silicon oxide in which 2 to 20% zinc oxide (ZnO) is further mixed may be used. In this case, an electron injection layer is preferably provided for the electroluminescent layer 242 so as to be in contact with the cathode 243.

Further, a metal with small work function, an alloy, an electric conductive compound, a compound of these material, or the like is formed with a film thickness enough to transmit light, and can be used as an cathode 243. Specifically, in addition to an alkali metal such as Li and Cs, and an alkaline earth metal such as Mg, Ca, and Sr, and an alloy including these (for example, Mg:Ag, Al:Li), a rare-earth metal such as Yb or Er, or the like can be used to form the cathode 243 with a film thickness of approximately 5 nm to 30 nm. When the electric injection layer is provided, another conductive layer such as Al is formed with a film thickness enough to transmit light, and can be used as the cathode 243. When the cathode 243 is formed with a film thickness enough to transmit light, a conductive layer having a light-transparent property is formed using a light-transparent conductive oxide material so as to be in contact with the top or the bottom of the cathode 243, and thus sheet resistance of the cathode may be suppressed. In the case where light is reflected from the cathode 243 side and preferably taken out only from the anode 240 side, the cathode 243 may be formed with a film thickness enough to reflect light.

After the light emitting element 244 is formed, a protective film may be formed over the cathode 243. As is the case with the third insulating film 234, a film which is hardly penetrated by a substance promoting deterioration of a light emitting element such as moisture and oxygen, as compared with other insulating films is used as the protective film. Typically, a DLC film, a carbon nitride film, a silicon nitride film formed by RF sputtering, or the like is preferably used. Further, a laminated film of the film which is hardly penetrated by a substance such as moisture and oxygen and a film which is easily penetrated by moisture and oxygen, as compared with the film, may be used as the protective film.

In FIG. 7B, an example where the anode is formed closer to a substrate than the cathode is described, however the invention is not limited to this structure. The cathode may be formed closer to the substrate than the anode.

After completing the step up to FIG. 7B in practice, packaging (sealing) is preferably performed by using a protective film (laminate film, ultraviolet curable resin film, or the like) or a light-transparent cover material with higher air tightness and a little degasification so as not to expose the light emitting element to the air. At this time, by making the inside of the cover material inert atmosphere, or by arranging a material having hygroscopic properties (for example, barium oxide) in the inside, the reliability of the light emitting element is improved.

Note that a method for manufacturing a light emitting device of the invention is not necessarily limited to the above modes. Further, a semiconductor display device of the invention includes not only a light emitting device but also a liquid crystal display device. The embodiment described above specifically describes a mode of the invention. Therefore, the invention is not limited to the above mentioned embodiment, and changes and modifications according to the technical idea of this invention are possible.

Further, a semiconductor display device may be formed by transferring a semiconductor element manufactured according to the above method to a flexible substrate such as plastic. There are various methods for transferring the semiconductor element, for example, a method of providing a metal oxide film between the substrate and the semiconductor element, separating the semiconductor element with embrittlement due to crystallization of the metal oxide film and transferring; a method of providing an amorphous silicon film including hydrogen between the substrate and the semiconductor element, irradiating with laser light or etching to remove the amorphous silicon film, separating the substrate and the semiconductor element and transferring; a method of mechanically separating the semiconductor element from the substrate in which the semiconductor element is formed or separating the semiconductor element from the substrate by etching with solution or gas and transferring or the like. Note that the step of the transferring may be performed before or after manufacturing the display element.

EMBODIMENT 2

In this embodiment, a positional relationship of a driver circuit and a protective circuit included in a semiconductor display device of the present invention is described.

Figure 8A:
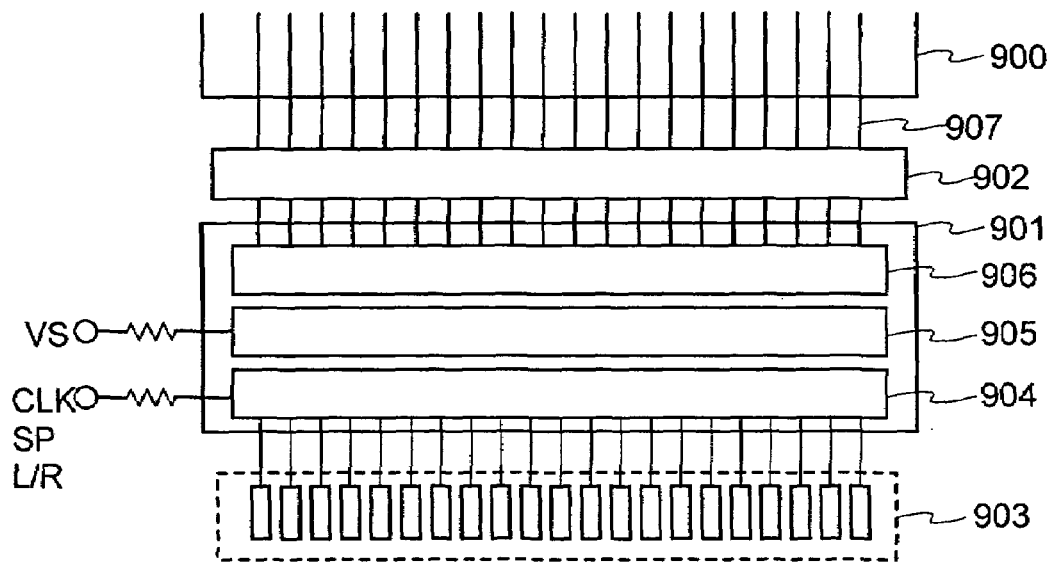
FIGS. 8A and 8B are diagrams showing positional relationship of a signal line driver circuit and a protective circuit included in a semiconductor display device of the invention.

A block diagram of a signal line driver circuit of this embodiment is shown in FIG. 8A. In FIG. 8A, reference numeral 900 corresponds to a pixel portion; 901, a signal line driver circuit; 902, a protective circuit; and 903, an input terminal. The signal line driver circuit 901 includes a shift register 904, a latch A 905, and a latch B 906.

A clock signal (CLK) and a start pulse signal (SP) are inputted into the shift register 904. A conversion signal (L/R) may be inputted in addition to the CLK and the SP. A timing signal is generated in the shift register 904 by inputting the CLK and the SP. The order of occurrence of pulse in the timing signal can be changed by L/R. The generated timing signal is inputted into the latch A 905 of the first stage sequentially. When the timing signal is inputted into the latch A 905, a video signal (VS) is written and stored into the latch A 905 in order in synchronization with the pulse of the timing signal. In this embodiment, the video signal is written into the latch A 905, however the invention is not limited to this structure. The latch A 905 constituted by a plurality of stages may be divided into some groups and the video signals may be inputted to each of the groups in parallel. Namely, so-called division driving may be carried out. Note that the number of the groups at this time is referred to as a division number. For example, in the case of dividing the latch into groups by four stages, it is referred to as a division driving in four.

A time required to terminate inputting video signals into all the latches of the stages in the latch A 905 is referred to as a line period. In practice, the line period may include a horizontal flyback period added to the aforementioned line period.

After a line period is terminated, a latch signal is supplied to the latch B 906 of the second stage and the video signals stored in the latch A 905 in synchronization with the latch signals is written into the latch B 906 all at once and stored therein. Subsequent video signals are inputted in synchronization with timing signals from the shift register 904 again into the latch A 905 after supplying the video signals to the latch B 906. In one line period of this second sequence, the video signals supplied and stored in the latch B 906 are inputted to the pixel portion 900 through a signal line 907.

Note that another circuit which can select a signal line such as a decoder circuit may be used as a substitute for the shift register 904.

In FIG. 8A, the protective circuit 902 is provided between the signal line driver circuit 901 and the pixel portion 900. The protective circuit 902 is connected to the signal line 907. By using the protective circuit 902, each of the semiconductor elements connected to the signal line 907 can be prevented from ESD.

In FIG. 8A, an example of connecting the protective circuit 902 to the signal line 907 is shown, however, the protective circuit may be provided for the wiring to input a video signal (VS) to the signal line driver circuit 901.

Figure 9:
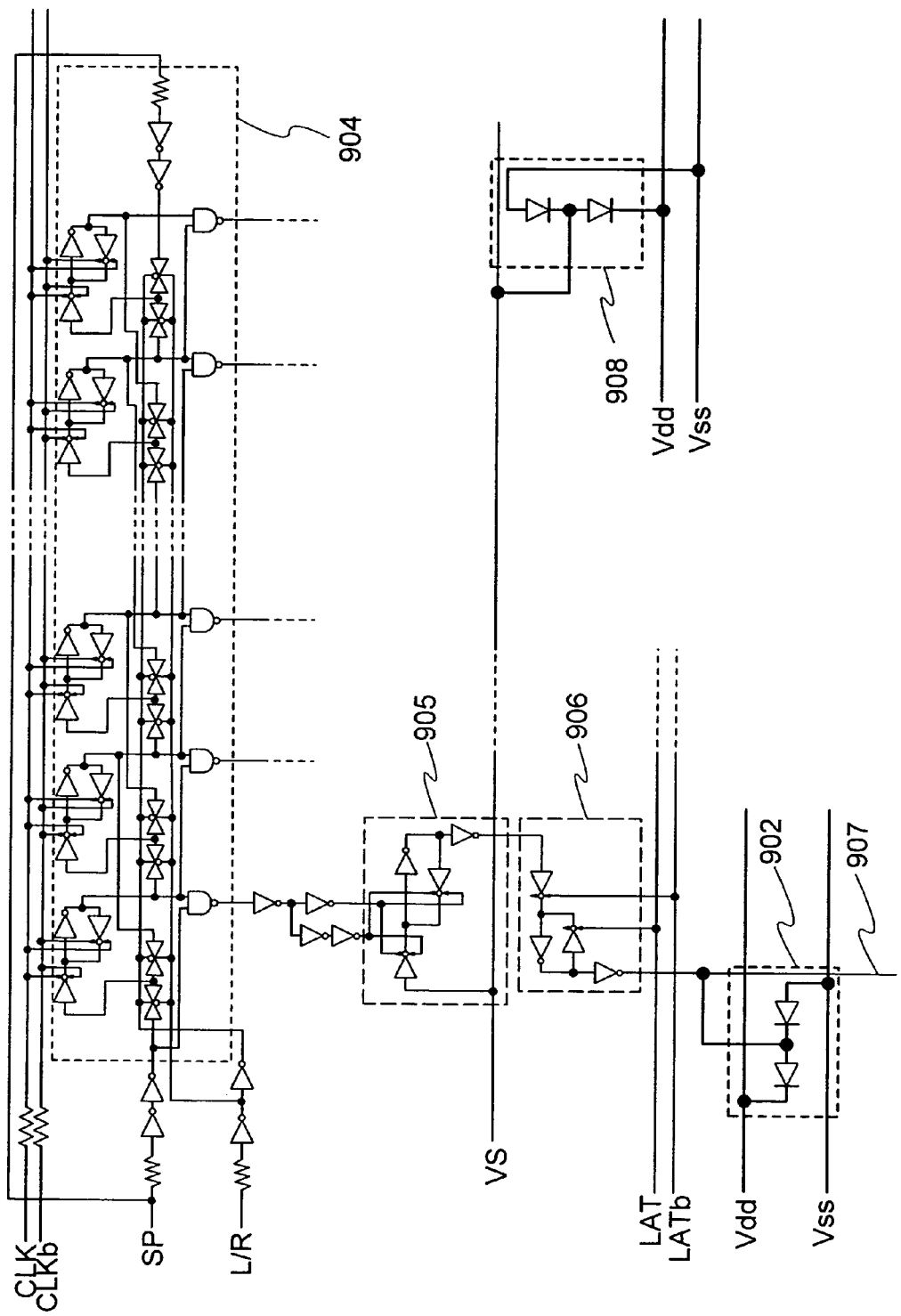
FIG. 9 is an equivalent circuit schematic of a signal line driver circuit and a protective circuit included in a semiconductor display device of the invention.

FIG. 9 shows an example of a specific circuit diagram of the shift register 904, the latch A 905, the latch B 906 and the protective circuit 902 which are shown in FIG. 8A. In FIG. 9, an example in which a protective circuit 908 is also provided for the wiring to input the video signal (VS) is shown. As shown in FIG. 9, a buffer, an inverter and the like may be provided in the interval of circuits.

Figure 10:
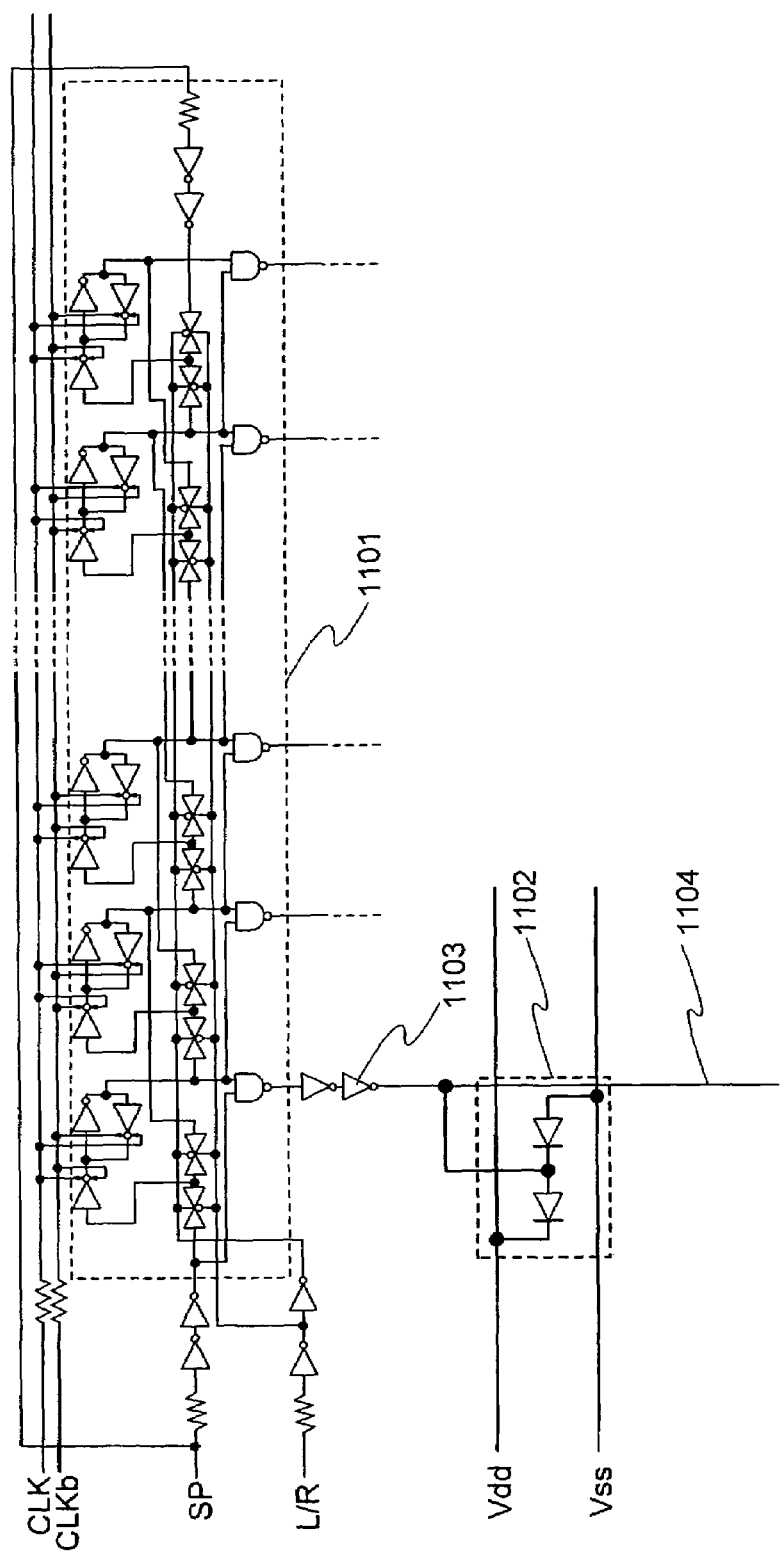
FIG. 10 is an equivalent circuit schematic of a scanning line driver circuit and a protective circuit included in a semiconductor display device of the invention.

In FIG. 10, an example of a specific circuit diagram of a shift register included in a scanning line driver circuit and a protective circuit connected to the scanning line is shown. In FIG. 10, the scanning line driver circuit includes a shift register 1101 and a buffer 1103. Reference numeral 1102 corresponds to a protective circuit and 1104 corresponds to a scanning line. A level shifter may be included in the scanning line driver circuit. A select signal is generated in the scanning line driver circuit when the CLK and the SP are inputted to the shift register 1101. The generated select signal is then buffer-amplified in the buffer 1103 and then inputted to the corresponding scanning line 1104. Gates of transistors in one line of pixels are connected to the scanning line 1104. As the transistors of one line of pixels have to be turned ON simultaneously, the buffer 1103 is required to be capable of applying a large current. The protective circuit 1102 is connected to the scanning line 1104.

Note that another circuit such as a decoder circuit that can select a signal line may be used instead of the shift register 1101.

In FIG. 8A, the protective circuit 902 connected to the signal line 907 is provided between the signal line driver circuit 901 and the pixel portion 900, however the invention is not limited to this structure. The position of the protective circuit 902 can be freely changed by forming the signal line 907 to be in contact with the surface of the first interlayer insulating film, connecting the signal line 907 to the wiring formed so as to be in contact with the surface of the second interlayer insulating film, and extending.

Figure 8B:
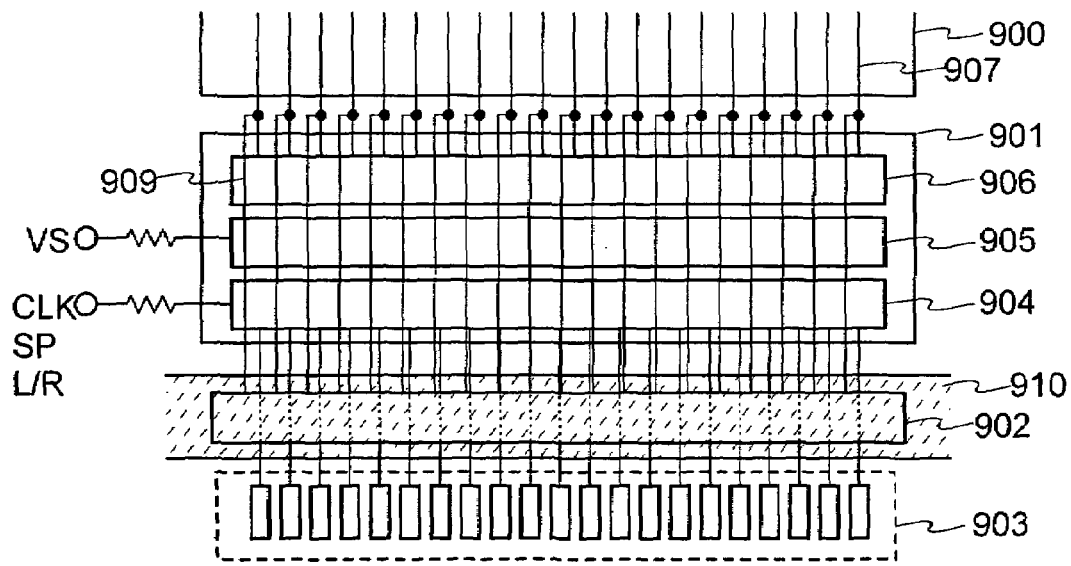

In FIG. 8B, an example that a protective circuit 902 connected to the signal line 907 is provided between the input terminal 903 and the signal line driver circuit 901 is shown. By extending a wiring 909, a sealant 910 for sealing a light emitting element between a substrate and a cover material and the protective circuit 902 can be overlapped, thus spaces can be effectively used.

Note that the signal line driver circuit and the scanning line driver circuit included in the semiconductor display device of the invention are not limited to the above structure. A designer can freely design the number of the signal line driver circuits and the layout thereof.

EMBODIMENT 3

Figure 11A:
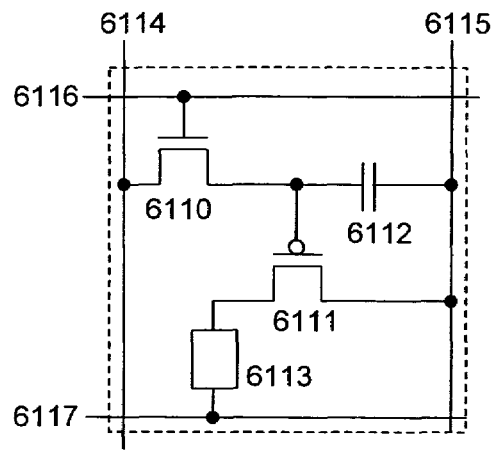
FIGS. 11A to 11C are equivalent circuit schematics of a pixel included in a light emitting device of the invention.

Next, a pixel of a light emitting device which corresponds to a mode of a semiconductor display device of the present invention is described with reference to FIGS. 11A to 11C. FIG. 11A shows an equivalent circuit schematic of a pixel, which includes a signal line 6114, power supply lines 6115 and 6117, a scanning line 6116, a light emitting element 6113, a TFT 6110 for controlling input of a video signal to the pixel, a TFT 6111 for controlling current value applied to both electrodes of the light emitting element 6113, and a capacitor element 6112 to store voltage between a gate electrode and a source region of the TFT 6111. In FIG. 11A, the capacitor element 6112 is shown, however, in the case of being capable to supply with gate capacitance of the TFT 6111 or other parasitic capacitance, the capacitor element 6112 may not be provided.

Figure 11B:
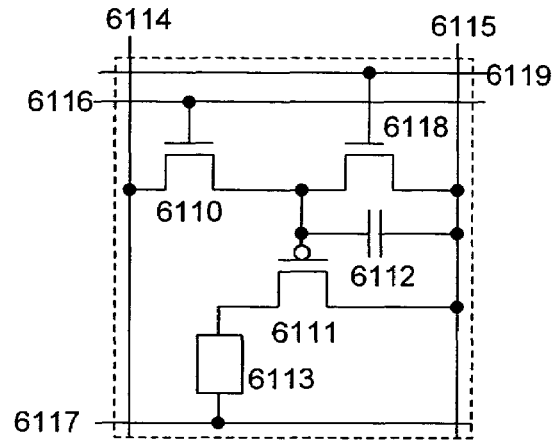

FIG. 11B is a pixel circuit in which the pixel shown in FIG. 11A is newly provided a TFT 6118 and a scanning line 6119. The current supplied to the light emitting element 6113 can be forcibly stopped in accordance with the configuration of the TFT 6118. Accordingly, a lighting period can be started simultaneously or shortly after a writing period before signals are written into all the pixels. Thus, duty ratio is increased and moving image can be displayed specifically well.

Figure 11C:
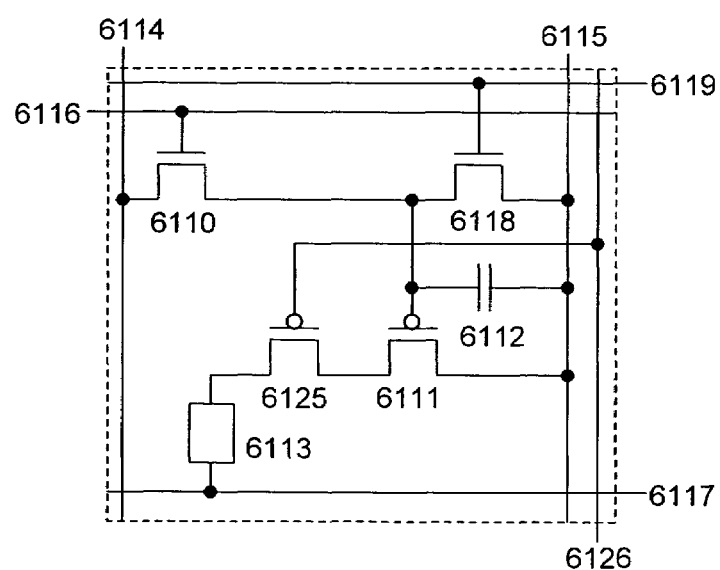

FIG. 11C is a pixel circuit in which the pixel shown in FIG. 11B is newly provided with a TFT 6125 and a wiring 6126. In this structure, by connecting a gate electrode of the TFT 6125 to a wiring 6126 storing in a constant electric potential, the electric potential of the gate electrode can be fixed, and can operate in a saturation range. Further, a gate electrode of the TFT 6111 which is operated in linear regions is serially connected to the TFT 6125, and a video signal to transmit information whether a pixel is lighting or non-lighting is inputted to the gate electrode through the TFT 6110. Since voltage value between a source region and a drain region of the TFT 6111 is small, slight fluctuation of the voltage between the gate electrode and the source region of the TFT 6111 does not influence on the current value which is applied to the light emitting element 6113. Therefore, the current value applied to the light emitting element 6113 is determined by the TFT 6125 which is operated in the saturation range. According to the light emitting device having the above mentioned structure, brightness unevenness of the light emitting element 6113 due to characteristic variation of the TFT 6125 can be improved and thus the image quality thereof can be increased. A channel length $L_1$ and a channel width $W_1$ of the TFT 6125, and a channel length $L_2$ and a channel width $W_2$ of the TFT 6111 are preferably set to be $L_1/W_1:L_2/W_2=5$ to $6000:1$. Further, both of the TFTs preferably have the same conductive type for the manufacturing steps. For the TFT 6125, a depletion mode TFT may be used as well as an enhancement mode TFT.

Either of an analog type video signal or a digital type video signal can be used for the light emitting device of the invention. However, in the case of using the digital type video signal, it depends on whether the video signal uses voltage or current. When the light emitting element is emitted, there are a signal in constant voltage and a signal in constant current, as for the video signal to be inputted to the pixel. When the video signal is the constant voltage, there are the one in which voltage applied to the light emitting element is constant, and the one in which current applied to the light emitting element is constant. In addition, when the video signal is in constant current, there are the one in which constant voltage is applied to a light emitting element and the one in which constant current is applied to a light emitting element. The former is referred to as a constant voltage drive and the latter is referred to as a constant current drive. In the constant current drive, constant current is applied regardless of resistance change in the light emitting element. In the light emitting device of the invention, a video signal of either of voltage or current for driving may be applied, and either of constant voltage drive or constant current drive may be applied. This embodiment can be freely combined with the above embodiment modes and embodiments.

EMBODIMENT 4

In this embodiment, a transformed example of a pixel shown in FIGS. 11A to 11C is described.

Figure 12A:
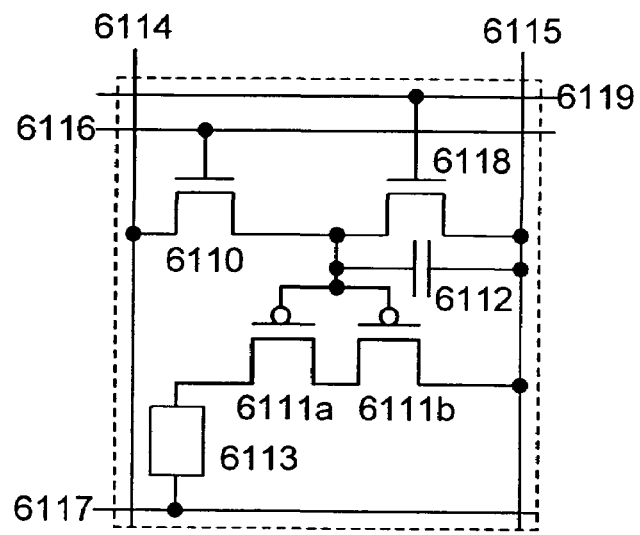
FIGS. 12A and 12B are equivalent circuit schematics of a pixel included in a light emitting device of the invention.

In FIG. 12A, an example of using two TFTs 6111a and 6111b which are serially connected instead of using a TFT 6111, in a pixel shown in FIG. 11B, is shown. The TFTs 6111a and 6111b have the same polarity, and gate electrodes of the TFTs are connected one another. Note that the substitution for the TFT 6111 is not limited to the number of two, and a plurality of TFTs may be used.

Similarly in the pixel shown in FIG. 11A, a plurality of TFTs serially connected can be used in substitution for the TFT 6111. Further, similarly in the pixel shown in FIG. 11C, a plurality of TFTs serially connected may be used in substitution for the TFT 6125.

Figure 12B:
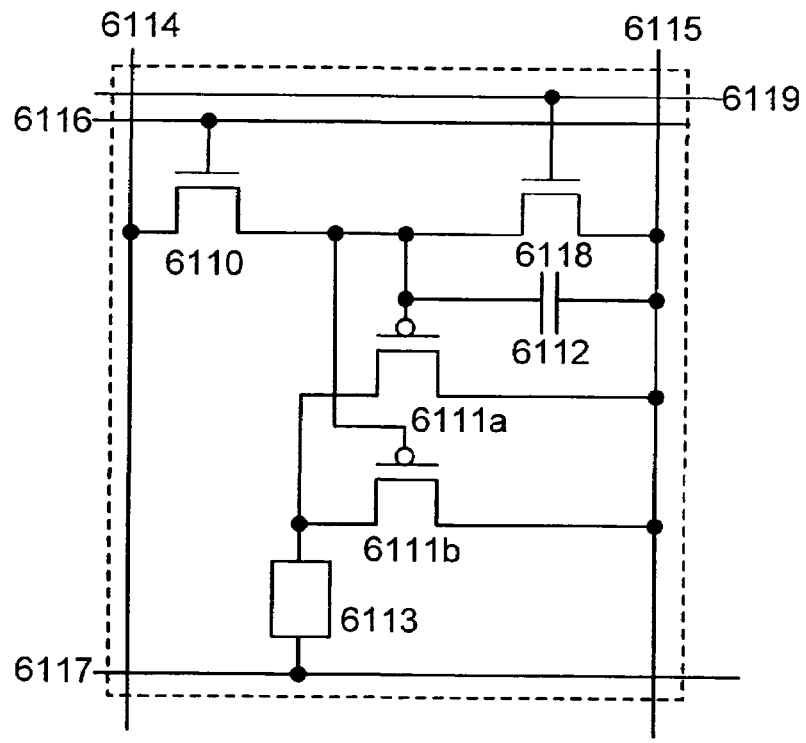

Next, an example of using two TFTs 6111*a* and 6111*b* connected in parallel in substitution for the TFT 6111 in a pixel shown in FIG. 11B is shown in FIG. 12B. The TFTs 6111*a* and 6111*b* have the same polarity, and gate electrodes of the TFTs are connected one another. Note that substitution for the TFTs is not limited to the number of two, and a plurality of TFTs may be used.

Similarly, in a pixel shown in FIG. 11A, a plurality of TFTs connected in parallel may be used in substitution for the TFT 6111. Further, similarly, in a pixel shown in FIG. 11C, a plurality of TFTs connected in parallel may be used in substitution for the TFT 6125.

In the pixels shown in FIGS. 11A and 11B, by operating the TFT 6111 in a saturation range, even when the light emitting element 6113 is deteriorated, current value applied to both electrodes of the light emitting element 6113 can be prevented from being decreased. Thus, brightness of the light emitting element 6113 can be prevented from being reduced. Further, in the pixel shown in FIG. 11C, by operating the TFT 6125 in a saturation range, even when the light emitting element 6113 is deteriorated, current value applied to both electrodes of the light emitting element 6113 can be prevented from being decreased. Thus, brightness of the light emitting element 6113 can be prevented from being reduced. And when the ratio of channel length to channel width of the TFTs 6111 and 6125 is higher, linearity of the drain current in the saturation range can be improved. And it is desirable since reduction in the brightness due to the deterioration can be further suppressed. However, when the channel length becomes larger, area of an island shape semiconductor film included in the TFTs is increased, and the area ratio (antenna ratio) of the island shape semiconductor film and the gate insulating film tends to increase. Like this embodiment, the increase of the antenna ratio can be controlled by using a plurality of TFTs in which each of the island shape semiconductor films are separated in substitution for the TFT 6111 and the TFT 6125.

Figure 13:
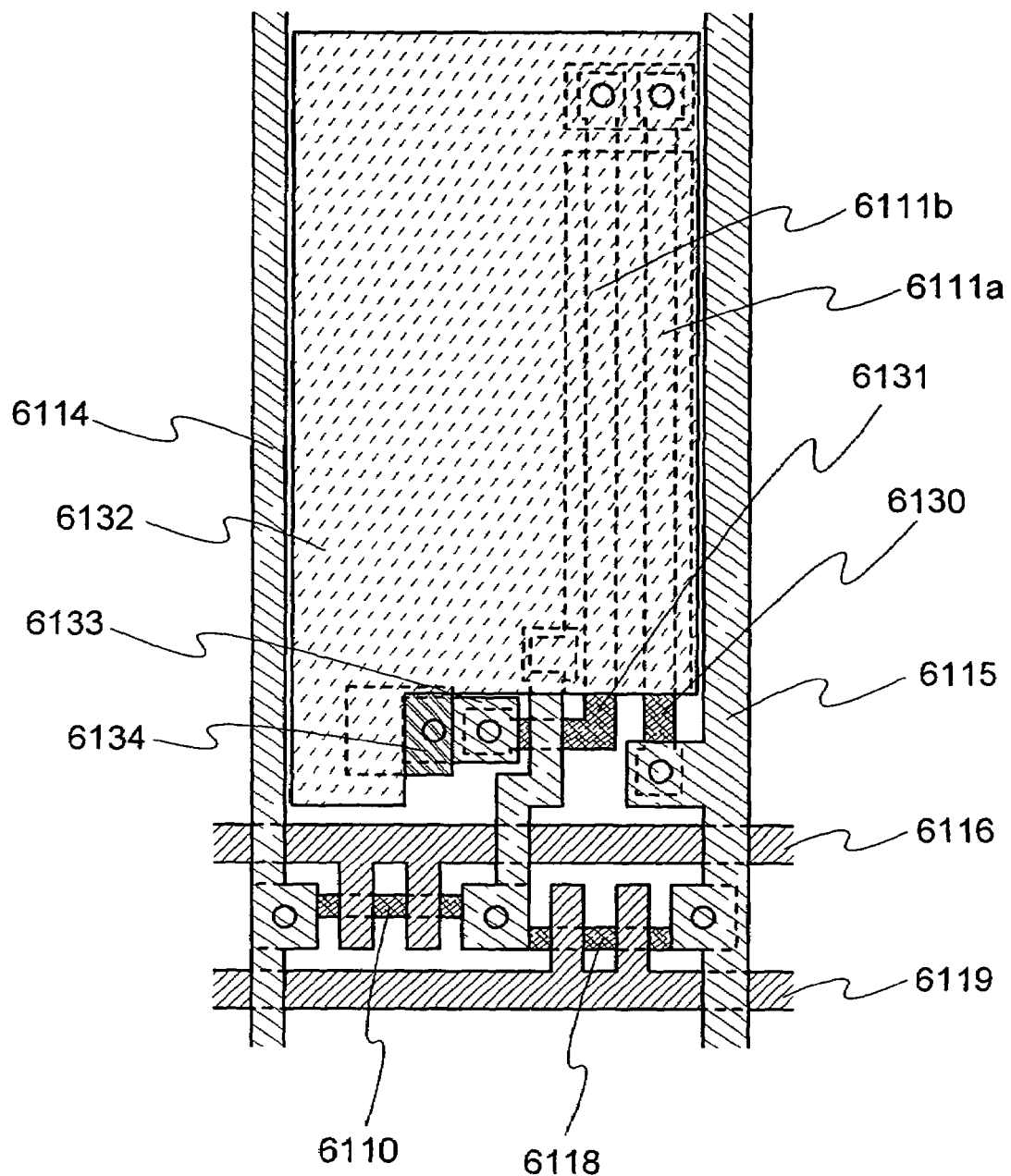
FIG. 13 is a top view of a pixel included in a light emitting device of the invention.

In FIG. 13, a top view of a pixel shown in FIG. 12A is shown as an example. In FIG. 13, the TFT 6111*a* and the TFT 6111*b* include island shape semiconductor films 6130 and 6131 each of which is separated. Further, the TFT 61111*b* is electrically connected to a first electrode 6132 included in the light emitting element 6113 through wirings 6133 and 6134. Note that the wiring 6133 is formed to be in contact with the surface of a first interlayer insulating film which covers the TFTs 6110, 6118, 6111*a* and 6111*b*. The wiring 6134 and the first electrode 6132 are formed so as to be in contact with the surface of a second interlayer insulating film formed over the first interlayer insulating film.

EMBODIMENT 5

Figure 14A:
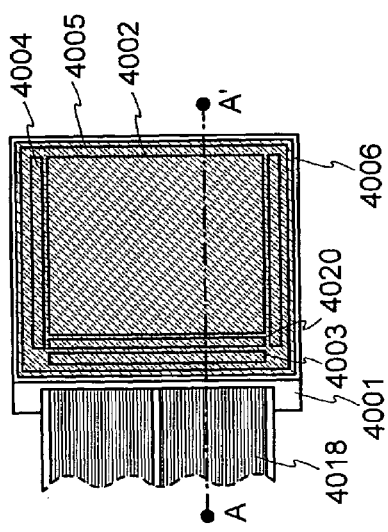
FIGS. 14A and 14B are a top view and a cross sectional view of a light emitting device of the invention.
Figure 14B:
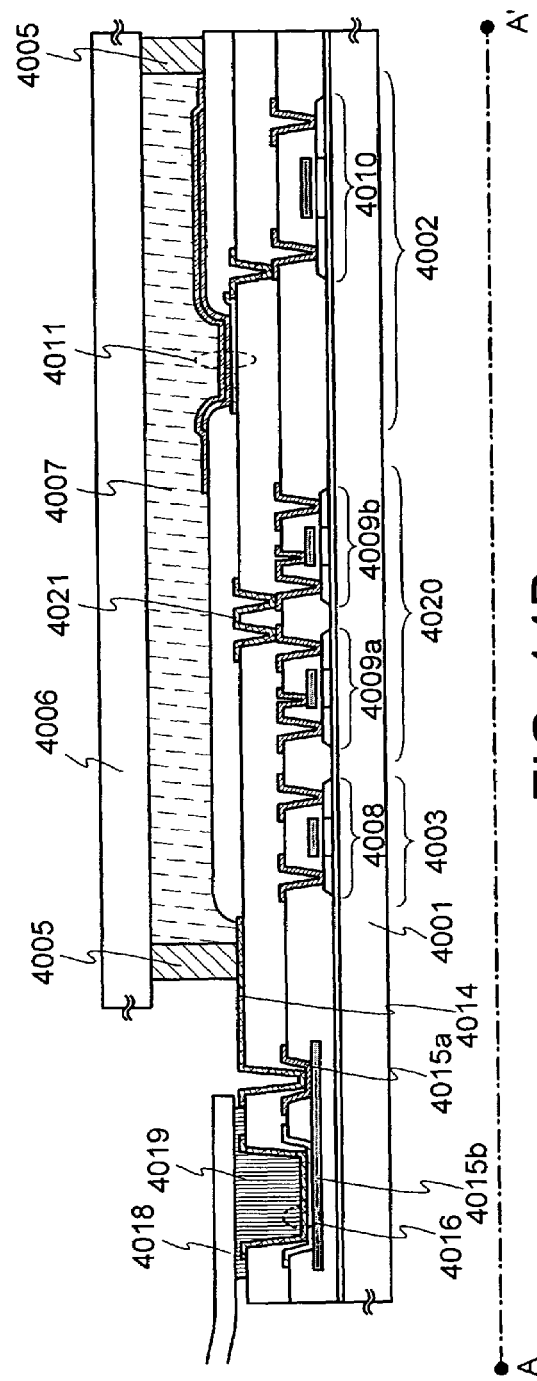

In this embodiment, an appearance of a panel of a light emitting device which corresponds to a mode of the present invention is described with reference to FIGS. 14A and 14B. FIG. 14A is a top view of the panel in which a transistor and a light emitting element formed over a substrate are sealed between the substrate and a cover material with a sealant. FIG. 14B corresponds to a cross sectional view taken along a line A-A' in FIG. 14A.

A sealant 4005 is provided so as to surround a pixel portion 4002, a signal line driver circuit 4003, a scanning line driver circuit 4004, and a protective circuit 4020 which are provided over a substrate 4001. Further, a cover material 4006 is provided over the pixel portion 4002, the signal line driver circuit 4003, and the scanning line driver circuit 4004. Thus, the pixel portion 4002, the signal line driver circuit 4003, and the scanning line driver circuits 4004 are sealed by the substrate 4001, a sealant 4005 and a cover material 4006 together with a filler 4007.

The pixel portion 4002, the signal line driver circuit 4003, the scanning line driver circuit 4004, and the protective circuit 4020 each of which is provided over the substrate 4001 include a plurality of TFTs. And in FIG. 14B, a TFT 4008 included in the signal line driver circuit 4003, TFTs 4009*a* and 4009*b* included in the protective circuit 4020, and a TFT 4010 included in the pixel portion 4002 are shown. The TFTs 4009*a* and 4009*b* included in the protective circuit 4020 are diode-connected and serially connected by a wiring 4021.

A reference numeral 4011 corresponds to a light emitting element, and electrically connected to the TFT 4010.

Further, a drawn wiring 4014 is a wiring for supplying a signal and power supply voltage to the pixel portion 4002, the signal line driver circuit 4003, the scanning line driver circuit 4004, and the protective circuit 4020. The drawn wiring 4014 is connected to a connection terminal 4016 through drawn wirings 4015*a* and 4015*b*. The connection terminal 4016 is electrically connected to a terminal included in an FPC 4018 through an anistropic conductive film 4019.

In addition to a glass material, a metal material (typically, stainless material) and a ceramics material, a flexible material typified by plastic can be used for the substrate 4001. As the plastic material, an FRP (fiberglass-Reinforced Plastics) plate, a PVF (polyvinyl fluoride) film, a mylar film, a polyester film or an acrylic resin film may be used. Further, a sheet having a structure in which an aluminum foil is sandwiched by the PVF films or the Mylar films can also be used. Furthermore, a light-transparent film such as a glass plate, a plastic plate, a polyester film, or an acrylic film is used for the cover material 4006.

Further, in addition to an inert gas such as nitrogen or argon, an ultraviolet curable resin or a thermosetting resin may be used as the filler 4007, and PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

In addition, a concave portion may be provided on the surface of the substrate 4001 side of the cover material 4006 and a hygroscopic substance or a substance that can absorb oxygen is arranged therein in order that the filler 4007 is made to be exposed to the hygroscopic substance (preferably, barium oxide) or the substance that can absorb oxygen.

A semiconductor display device of the invention includes a panel in which a pixel portion with a display element is formed, and a module in which the panel is mounted with an IC.

EMBODIMENT 6

A semiconductor display device of the present invention can be applied to various kinds of electronic equipment. The following electronic equipment using the semiconductor display device of the invention is given as examples: a video camera, a digital camera, a goggles-type display (head mount display), a navigation system, a sound reproduction device (such as a car audio equipment and an audio set), a notebook type personal computer, a game machine, a personal digital assistant (such as a mobile computer, a mobile telephone, a portable game machine, or an electronic book), an image reproduction apparatus including a recording medium (more specifically, an apparatus which can reproduce a recording medium such as a digital versatile disc (DVD) and so fourth, and includes a display for displaying the reproduced image), and the like. These examples of the electric equipment are shown in FIG. 15A to 15C.

Figure 15A:
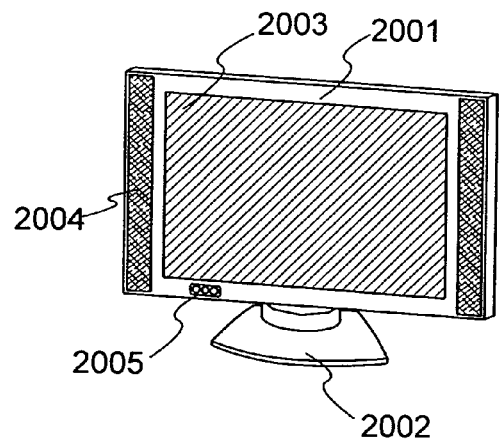
FIGS. 15A to 15C are diagrams of electric equipment using a semiconductor display device of the invention.

FIG. 15A is a display device, which includes a case 2001, a supporting medium 2002, a display portion 2003, a speaker portion 2004, a video input terminal 2005, and the like. A semiconductor display device of the invention can be applied to the display portion 2003. The display portion can be thinner than that of a liquid crystal display, since the light emitting device is a self-luminous type, and needs no back-light. Note that the light emitting display device includes all information display devices such as a personal computer, TV broadcast receive, and advertising display.

Figure 15B:
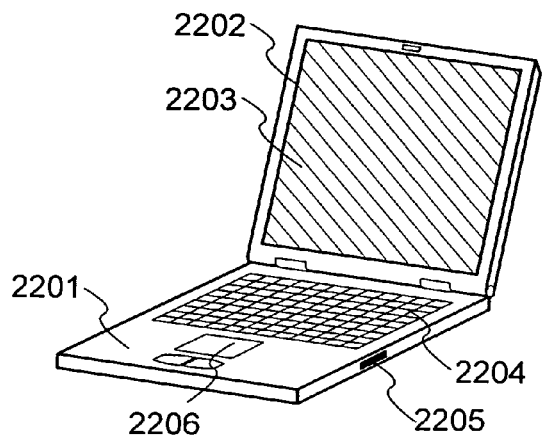

FIG. 15B is a notebook type personal computer, which includes a main body 2201, a case 2202, a display portion 2203, a keyboard 2204, and an exterior connection port 2205, a mouse 2206, and the like. A semiconductor display device of the invention can be applied to the display portion 2203.

Figure 15C:
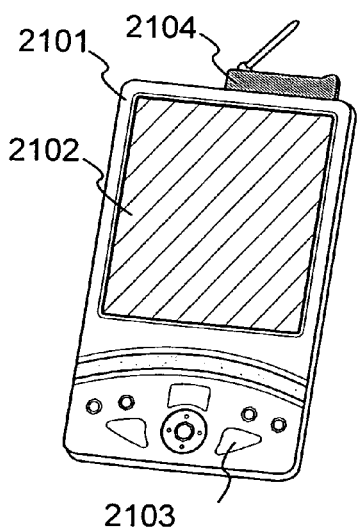

FIG. 15C is a personal digital assistant (PDA), which includes a main body 2101, a display portion 2102, an operation switch 2103, a modem 2104, and the like. The modem 2104 may be incorporated in the main body 2101. A semiconductor display device of the invention can be applied to the display portion 2102.

As described above, the invention is widely applicable to variety kinds of electric equipment. Further, a semiconductor display device having any structures shown in Embodiments 1 to 5 may be used for the electronic equipment of this embodiment.

What is claimed is:

1. A semiconductor display device comprising:
at least a first thin film transistor and a second thin film transistor;
a first interlayer insulating film formed so as to cover the first thin film transistor and the second thin film transistor;
first, second and third wirings formed over and within the first interlayer insulating film;
a second interlayer insulating film formed over the first interlayer insulating film;
fourth and fifth wirings formed over and within the second interlayer insulating film; and
a display element formed over the second interlayer insulating film and connected to the fifth wiring,
wherein the first wiring is connected to a first terminal and a gate electrode included in the first thin film transistor through first and second contact holes formed in the first interlayer insulating film,
wherein the second wiring is connected to a second terminal included in the first thin film transistor through a third contact hole formed in the first interlayer insulating film,
wherein the third wiring is connected to a first terminal or a second terminal included in the second thin film transistor through a fourth contact hole formed in the first interlayer insulating film,
wherein the fourth wiring is connected to the second wiring through a fifth contact hole formed in the second interlayer insulating film, and
wherein the fifth wiring is connected to the third wiring through a sixth contact hole formed in the second interlayer insulating film.

2. A semiconductor display device comprising:
at least first, second and third thin film transistors;
a first interlayer insulating film formed so as to cover the first, second and third thin film transistors;
first, second, third and fourth wirings formed over and within the first interlayer insulating film;
a second interlayer insulating film formed over the first interlayer insulating film;
fifth and sixth wirings formed over and within the second interlayer insulating film; and
a display element formed over the second interlayer insulating film and connected to the sixth wiring,
wherein the first wiring is connected to a first terminal and a gate electrode included in the first thin film transistor through first and second contact holes formed in the first interlayer insulating film,
wherein the second wiring is connected to a second terminal included in the first thin film transistor and a first terminal and a gate electrode included in the second thin film transistor through third, fourth and fifth contact holes formed in the first interlayer insulting film,
wherein the third wiring is connected to a second terminal included in the second thin film transistor through a sixth contact hole formed in the first interlayer insulating film,
wherein the fourth wiring is connected to a first terminal or a second terminal included in the third thin film transistor through a seventh contact hole formed in the first interlayer insulating film,
wherein the fifth wiring is connected to the second wiring through eighth and ninth contact holes formed in the second interlayer insulating film, and
wherein the sixth wiring is connected to the fourth wiring through a tenth contact hole formed in the second interlayer insulating film.

3. A semiconductor display device according to claim 1, wherein the display element is a light emitting element, the light emitting element comprising:
a first electrode;
an electroluminescent layer formed over the first electrode; and
a second electrode formed over the electroluminescent layer,
wherein the second electrode has a light-transparent property.

4. A semiconductor display device according to claim 2, wherein the display element is a light emitting element, the light emitting element comprising:
a first electrode;
an electroluminescent layer formed over the first electrode; and
a second electrode formed over the electroluminescent layer,
wherein the second electrode has a light-transparent property.

5. A semiconductor display device according to claim 1, wherein the second interlayer insulating film is formed by a coating method.

6. A semiconductor display device according to claim 2, wherein the second interlayer insulating film is formed by a coating method.

7. A semiconductor display device according to claim 1, wherein the second interlayer insulating film is formed of a plurality of insulating films and any one of the plurality of insulating films is formed by a coating method.

8. A semiconductor display device according to claim 2, wherein the second interlayer insulating film is formed of a plurality of insulating films and any one of the plurality of insulating films is formed by a coating method.

9. A semiconductor display device according to claim 1, wherein the second interlayer insulating film comprises an organic resin film or an inorganic insulating film.

10. A semiconductor display device according to claim 2, wherein the second interlayer insulating film comprises an organic resin film or an inorganic insulating film.

11. A semiconductor display device according to claim 1, wherein the second interlayer insulating film comprises an insulating film formed by using a material of a siloxane group.

12. A semiconductor display device according to claim 2, wherein the second interlayer insulating film comprises an insulating film formed by using a material of a siloxane group.

13. A semiconductor display device according to claim 1, wherein the gate electrode included in the first thin film transistor and a gate electrode included in the second thin film transistor are taper-shaped.

14. A semiconductor display device according to claim 2, wherein the gate electrode included in the first thin film transistor, the gate electrode included in the second thin film transistor and a gate electrode included in the third thin film transistor are taper-shaped.

15. An electronic equipment having the semiconductor display device according to claim 1.

16. An electronic equipment according to claim 15, wherein the electronic equipment is selected from the group consisting of a video camera, a digital camera, a goggle type display, a navigation system, a sound reproduction device, a notebook type personal computer, a game machine, a personal digital assistant, an image reproduction apparatus including a recording medium.

17. An electronic equipment having the semiconductor display device according to claim 2.

18. An electronic equipment according to claim 17, wherein the electronic equipment is selected from the group consisting of a video camera, a digital camera, a goggle type display, a navigation system, a sound reproduction device, a notebook type personal computer, a game machine, a personal digital assistant, an image reproduction apparatus including a recording medium.

19. A semiconductor display device according to claim 1, wherein the first thin film transistor is provided in a protective circuit and the second thin film transistor is provided in a pixel portion.

20. A semiconductor display device according to claim 2, wherein the first and second thin film transistors are provided in a protective circuit and the third thin film transistor is provided in a pixel portion.

21. A semiconductor display device according to claim 19, wherein the protective circuit is provided between the pixel portion and a driver circuit.

22. A semiconductor display device according to claim 20, wherein the protective circuit is provided between the pixel portion and a driver circuit.

23. A semiconductor display device according to claim 19, wherein the protective circuit is connected to a signal line.

24. A semiconductor display device according to claim 20, wherein the protective circuit is connected to a signal line.

25. A semiconductor display device according to claim 19, wherein the protective circuit is connected to a scanning line.

26. A semiconductor display device according to claim 20, wherein the protective circuit is connected to a scanning line.

27. A semiconductor display device according to claim 1, wherein the first interlayer insulating film comprises a silicon oxide film, a silicon nitride film, or a silicon oxynitride film.

28. A semiconductor display device according to claim 2, wherein the first interlayer insulating film comprises a silicon oxide film, a silicon nitride film, or a silicon oxynitride film.

29. A semiconductor display device according to claim 1, further comprising:
a barrier formed over the second interlayer insulating film and the fourth and fifth wirings.

30. A semiconductor display device according to claim 2, further comprising:
a barrier formed over the second interlayer insulating film and the fifth and sixth wirings.

* * * * *